US010502646B2

(12) United States Patent
Ishikawa et al.

(10) Patent No.: US 10,502,646 B2
(45) Date of Patent: Dec. 10, 2019

(54) MAGNETOSTRICTIVE SENSOR, MAGNETIC STRUCTURE AND PRODUCTION METHOD THEREOF, MOTOR DRIVE DEVICE PROVIDED WITH MAGNETOSTRICTIVE SENSOR, AND MOTORASSISTED BICYCLE

(71) Applicant: YAMAHA HATSUDOKI KABUSHIKI KAISHA, Iwata-shi, Shizuoka (JP)

(72) Inventors: Satomi Ishikawa, Iwata (JP); Hiroshi Matsumoto, Iwata (JP)

(73) Assignee: YAMAHA HATSUDOKI KABUSHIKI KAISHA, Iwata-Shi, Shizuoka (JP)

( * ) Notice: Subject to any disclaimer, the term of this patent is extended or adjusted under 35 U.S.C. 154(b) by 208 days.

(21) Appl. No.: 15/852,700

(22) Filed: Dec. 22, 2017

(65) Prior Publication Data
US 2018/0120178 A1    May 3, 2018

Related U.S. Application Data

(63) Continuation-in-part of application No. PCT/JP2016/068720, filed on Jun. 23, 2016.

(30) Foreign Application Priority Data

Jun. 23, 2015 (JP) .................................. 2015-125842
Jun. 23, 2015 (JP) .................................. 2015-125843

(51) Int. Cl.
*G01L 3/10* (2006.01)
*B62M 6/50* (2010.01)
*H01L 41/12* (2006.01)

(52) U.S. Cl.
CPC ............... *G01L 3/102* (2013.01); *B62M 6/50* (2013.01); *G01L 3/103* (2013.01); *G01L 3/105* (2013.01); *H01L 41/125* (2013.01)

(58) Field of Classification Search
CPC . G01L 3/102–105; H01L 41/125; B62M 6/50
See application file for complete search history.

(56) References Cited

U.S. PATENT DOCUMENTS 4,703,550 A * 11/1987 Hilzinger ................ G01L 3/102
                                                            164/463
4,727,757 A *  3/1988 Hilzinger ................ G01L 3/102
                                                            428/611
(Continued)

FOREIGN PATENT DOCUMENTS

EP       0404569 A2    12/1990
EP       1626260 A1     2/2006
(Continued)

OTHER PUBLICATIONS

Chikazumi, Soshin et al., Handbook of Magnetic Material, Asakura Publishing Co., Ltd., New Edition, Apr. 1, 2006, pp. 1082-1083; p. 3 of spec.

(Continued)

*Primary Examiner* — Jonathan M Dunlap
(74) *Attorney, Agent, or Firm* — Rabin & Berdo, P.C.

(57) ABSTRACT

A magnetostrictive sensor including a magnetic structure. The magnetic structure has a columnar substrate extending along an axis, and a magnetostrictive portion disposed on an outer peripheral surface of the substrate. The magnetostrictive portion includes a plurality of portions that have different concentrations of at least one of a plurality of elements, the portions being so arranged as to satisfy at least one of a first requirement that in a first cross sectional view of the magnetostrictive portion orthogonal to the axis, the portions are arranged clockwise about the axis, a second requirement that in the first cross sectional view, the portions are arranged in a thickness direction of the magnetostrictive portion, and a third requirement that, in a second cross sectional view of the magnetostrictive portion that is
(Continued)

orthogonal to the first cross sectional view and passes through the axis, the portions are arranged along the axis.

14 Claims, 22 Drawing Sheets

(56) References Cited

U.S. PATENT DOCUMENTS

| | | | |
|---|---|---|---|
| 4,823,620 A | | 4/1989 | Edo et al. |
| 4,833,926 A | * | 5/1989 | Todoroki ............... G01L 3/102 |
| | | | 73/862.041 |
| 4,852,411 A | * | 8/1989 | Beihoff ................. G01L 3/102 |
| | | | 73/862.335 |
| 5,201,964 A | | 4/1993 | Savage et al. |
| 5,280,729 A | | 1/1994 | Aoki et al. |
| 5,313,845 A | | 5/1994 | Hayashi et al. |
| 5,321,985 A | | 6/1994 | Kashiwagi et al. |
| 5,353,649 A | | 10/1994 | Hase et al. |
| 5,585,574 A | | 12/1996 | Sugihara et al. |
| 6,412,356 B1 | * | 7/2002 | Kouketsu ............... G01L 3/102 |
| | | | 73/862.193 |
| 7,564,152 B1 | | 7/2009 | Clark et al. |
| 10,184,847 B2 | * | 1/2019 | Ishikawa ................. B62M 6/50 |
| 10,281,346 B2 | * | 5/2019 | Matsumoto ............... G01L 3/10 |
| 2007/0022809 A1 | | 2/2007 | Yoshida et al. |
| 2007/0068280 A1 | | 3/2007 | Cripe |
| 2018/0120177 A1 | * | 5/2018 | Ishikawa ................. B62M 6/50 |
| 2018/0120178 A1 | * | 5/2018 | Ishikawa ................. B62M 6/50 |
| 2018/0224342 A1 | * | 8/2018 | Matsumoto ............. G01L 3/102 |
| 2018/0226565 A1 | * | 8/2018 | Matsumoto ............. G01L 3/102 |

FOREIGN PATENT DOCUMENTS

| | | |
|---|---|---|
| JP | S60-254679 A | 12/1985 |
| JP | H03-002638 A | 1/1991 |
| JP | H03-054429 A | 3/1991 |
| JP | H04-329325 A | 11/1992 |
| JP | H05-072064 A | 3/1993 |
| JP | H06-241923 A | 9/1994 |
| JP | H06-291384 A | 10/1994 |
| JP | H09-008378 A | 1/1997 |
| JP | 2004-184189 A | 7/2004 |
| JP | 2004-264188 A | 9/2004 |
| JP | 2004-340783 A | 12/2004 |
| JP | 2007-093244 A | 4/2007 |
| JP | 4936969 B2 | 5/2012 |

OTHER PUBLICATIONS

Richard M. Bozorth, Ferromagnetism, 1993, Editorial Board Institute of Electrical and Electronics Engineers, pp. 197, 664 (1993); p. 3 of spec.

* cited by examiner

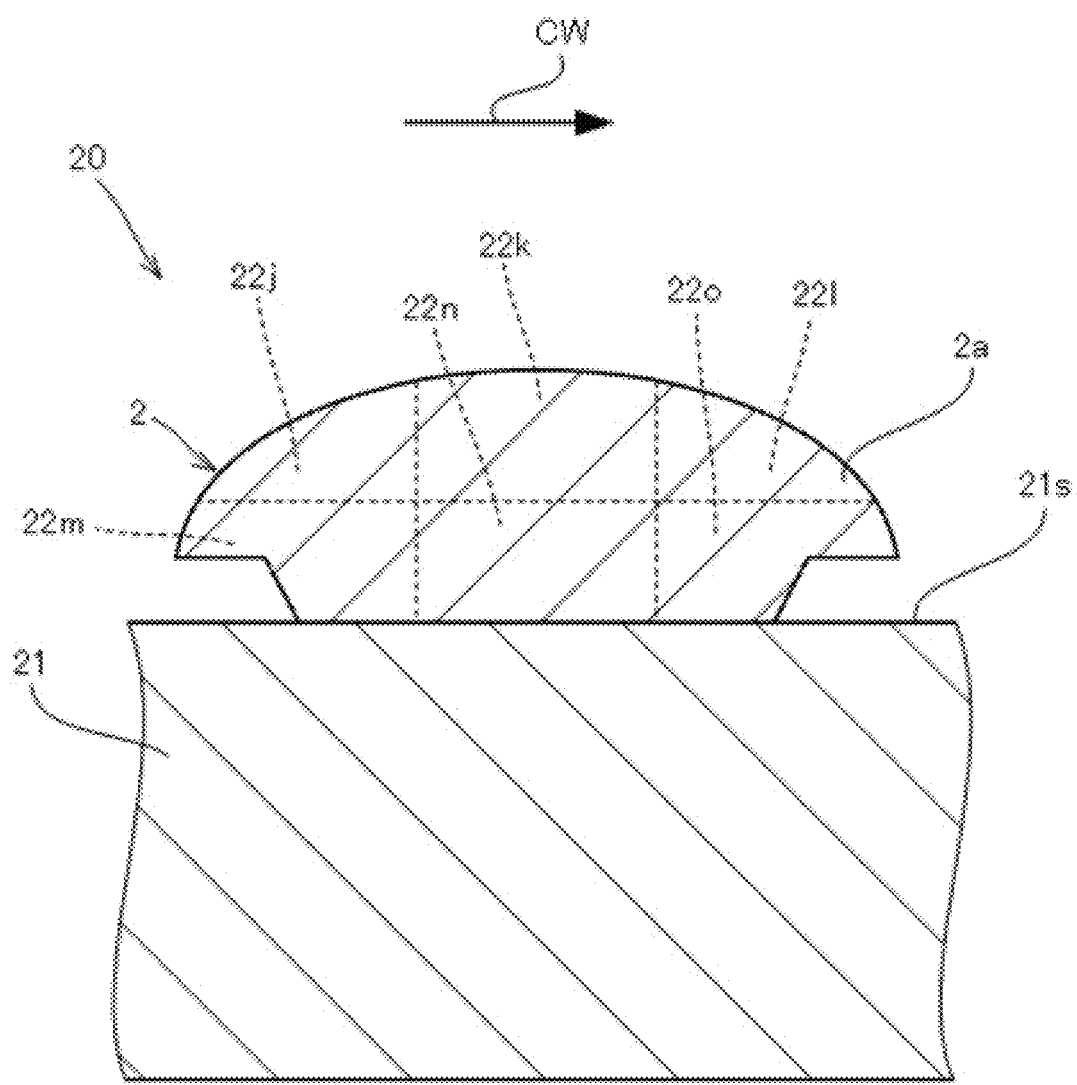

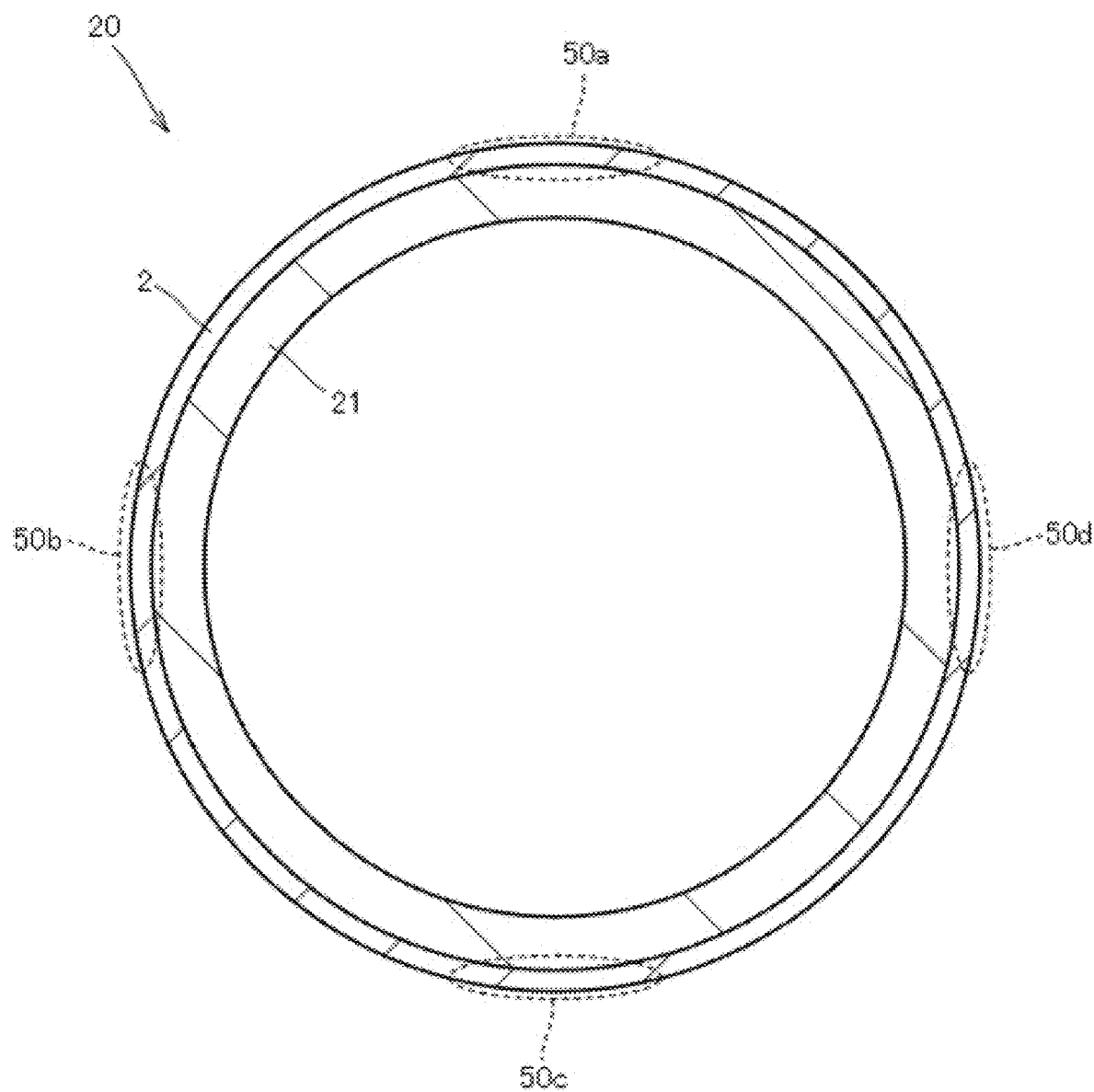

MAGNETOSTRICTIVE SENSOR, MAGNETIC STRUCTURE AND PRODUCTION METHOD THEREOF, MOTOR DRIVE DEVICE PROVIDED WITH MAGNETOSTRICTIVE SENSOR, AND MOTORASSISTED BICYCLE

CROSS-REFERENCES TO RELATED APPLICATIONS

The present application is a continuation-in-part application of International Application No. PCT/JP2016/068720, filed on Jun. 23, 2016, and having the benefit of the earlier filing dates of Japanese Application No. 2015-125842, filed on Jun. 23, 2015 and Japanese Application No. 2015-125843, filed on Jun. 23, 2015. The content of each of the identified applications is incorporated herein by reference in its entirety.

TECHNICAL FIELD

The present invention relates to a magnetostrictive sensor, a magnetic structure, a method for fabricating the magnetic structure, a motor-driven device including the magnetostrictive sensor, and an electric motor-assisted bicycle including the magnetostrictive sensor.

BACKGROUND ART

A magnetostrictive sensor is typically used for detecting a torque or a load. In many magnetostrictive sensors, a magnetostrictive portion containing a magnetostrictive material is formed on an outer peripheral surface of a member (substrate) on which a torque or a load acts. In a magnetostrictive sensor having such a structure, a coil is disposed to surround the substrate on which the magnetostrictive portion is formed.

The above-described structure of the magnetostrictive sensor causes a magnetic permeability of the magnetostrictive material of the magnetostrictive portion to change when a force acts on the substrate on which the magnetostrictive portion is formed. Accordingly, the impedance of the coil disposed to surround the magnetostrictive portion changes. The magnetostrictive sensor detects the change in the impedance of the coil, thereby detecting a torque or a load.

Sensitivity of such a magnetostrictive sensor is affected by a magnetostriction constant and a magnetic permeability of a magnetostrictive material. The magnetostriction constant and the magnetic permeability of the magnetostrictive material vary depending on a chemical composition of the magnetostrictive material. For example, as disclosed in Non-patent Document 1, a Fe—Ni alloy shows significant changes of the magnetostriction constant and the magnetic permeability depending on the Ni content in the alloy. As also disclosed in Non-patent Document 2, for example, a Fe—Co alloy shows significant changes of the magnetostriction constant and the magnetic permeability depending on the Co content in the alloy.

In view of this, in techniques employed to date, the chemical composition of the magnetostrictive material for use in a magnetostrictive sensor is adjusted to increase sensitivity of the magnetostrictive sensor. Specifically, the chemical composition of the magnetostrictive material is adjusted in such a manner that the magnetostriction constant and the magnetic permeability have values suitable for increasing sensitivity of the magnetostrictive sensor.

For example, Patent Document 1 discloses a magnetostrictive torque sensor including a magnetostrictive film made of a Ni—Fe alloy. In the magnetostrictive torque sensor of Patent Document 1, the chemical composition of the Ni—Fe alloy (magnetostrictive film) is adjusted in such a manner that the product of the magnetostriction constant and the magnetic permeability is 90% or more of the maximum value thereof.

CITATION LIST

Patent Document

Patent Document 1: Japanese Patent Application Publication No. 2007-93244

Non-Patent Document

Non-patent Document 1: Chikazumi, Soshin et al., Handbook of Magnetic Material, Asakura Publishing Co., Ltd., New Edition, Apr. 1, 2006, pp. 1082-1083

Non-patent Document 2: RICHARD M. BOZORTH, Ferromagnetism, 1993, Editorial Board Institute of Electrical and Electronics Engineers, pp. 197, 664 (1993)

SUMMARY OF INVENTION

Through examination of manufacturing magnetostrictive sensors, there arose a demand for more efficiently manufacturing magnetostrictive sensors with high sensitivity.

The present invention relates to a configuration that enables efficient manufacturing of magnetostrictive sensors with high sensitivity.

It has been known to date that there is a combination of a magnetostriction constant and a magnetic permeability suitable for increasing sensitivity of a magnetostrictive sensor including a magnetostrictive portion made of a predetermined magnetostrictive material. In addition, as described above, the magnetostriction constant and the magnetic permeability vary depending on the chemical composition of the magnetostrictive material. Thus, the magnetostrictive portion has been formed to date in such a manner that the magnetostrictive material has a predetermined chemical composition in the entire magnetostrictive portion to obtain a magnetostriction constant and a magnetic permeability suitable for increasing sensor sensitivity.

On the other hand, unless the magnetostrictive material cannot be adjusted to have a predetermined chemical composition in forming the magnetostrictive portion, sensitivity of the magnetostrictive sensor cannot be sufficiently increased. Thus, to increase sensitivity of the magnetostrictive sensor, it has been necessary to date to strictly control the chemical composition of the magnetostrictive material in forming the magnetostrictive portion. That is, an increase in sensitivity of a magnetostrictive sensor and facilitation of manufacturing the magnetostrictive sensor cannot be achieved at the same time in techniques employed to date.

In view of this, inventors of the present invention conducted various studies to achieve both an increase in sensitivity of a magnetostrictive sensor and facilitation of manufacturing of the magnetostrictive sensor at the same time. Through the studies, the chemical composition of the magnetostrictive material constituting the magnetostrictive portion was investigated in detail again. Consequently, it was found that a stress occurs inside the magnetostrictive portion when the magnetostrictive portion includes portions having different chemical compositions of the magnetostrictive material. More specifically, it was found that in a magnetostrictive portion made of a magnetostrictive material including a plurality of elements, the presence of portions having different concentrations of one of the elements causes a stress inside the magnetostrictive portion.

Further investigation of the inventors on the magnetostrictive portion shows that in the magnetostrictive sensor including the magnetostrictive portion in which an internal stress occurs as described above, sensor sensitivity can be increased without strict control of the chemical composition of the magnetostrictive material in forming the magnetostrictive portion. Specifically, it was found that sensor sensitivity can be sufficiently increased even if the chemical composition of the magnetostrictive material deviates to some degree from a target chemical composition (e.g., chemical composition theoretically determined in order to increase the sensor sensitivity). That is, the inventors found that generation of a stress inside the magnetostrictive portion can achieve both an increase in sensitivity of the magnetostrictive sensor and facilitation of manufacturing of the magnetostrictive sensor at the same time.

Based on the foregoing findings, inventors arrived at a configuration of a magnetostrictive sensor described below.

A magnetostrictive sensor according to an embodiment of the present invention includes a magnetic structure including a columnar substrate extending along an axis and a magnetostrictive portion disposed on an outer peripheral surface of the substrate and containing a plurality of elements. The magnetostrictive portion includes a plurality of portions that have different concentrations of at least one of the plurality of elements, and the portions are so arranged as to satisfy at least one of a first requirement that in a first cross sectional view of the magnetostrictive portion orthogonal to the axis, the portions having different concentrations of the at least one element are arranged clockwise about the axis, a second requirement that in the first cross sectional view, the portions having different concentrations of the at least one element are arranged in a thickness direction of the magnetostrictive portion, and a third requirement that, in a second cross sectional view of the magnetostrictive portion that is orthogonal to the first cross sectional view and passes thorough the axis, the portions having different concentrations of the at least one element are arranged along the axis.

Advantageous Effects of Invention

A magnetostrictive sensor according to an embodiment of the present invention can have increased sensitivity and can be manufactured efficiently.

BRIEF DESCRIPTION OF DRAWINGS

FIG. 8 illustrates another example of the cross section taken along line D-D in FIG. 2.

FIG. 9 illustrates a simplified cross section taken along line D-D in FIG. 2.

DESCRIPTION OF EMBODIMENTS

Embodiments of the present invention will be described in detail with reference to the drawings. In the following description, dimensions of components in each drawing do not strictly represent actual dimensions of components, dimensional ratios of components, and the like.

1. Magnetostrictive Sensor 1.1. Configuration of Magnetostrictive Sensor

Figure 1:
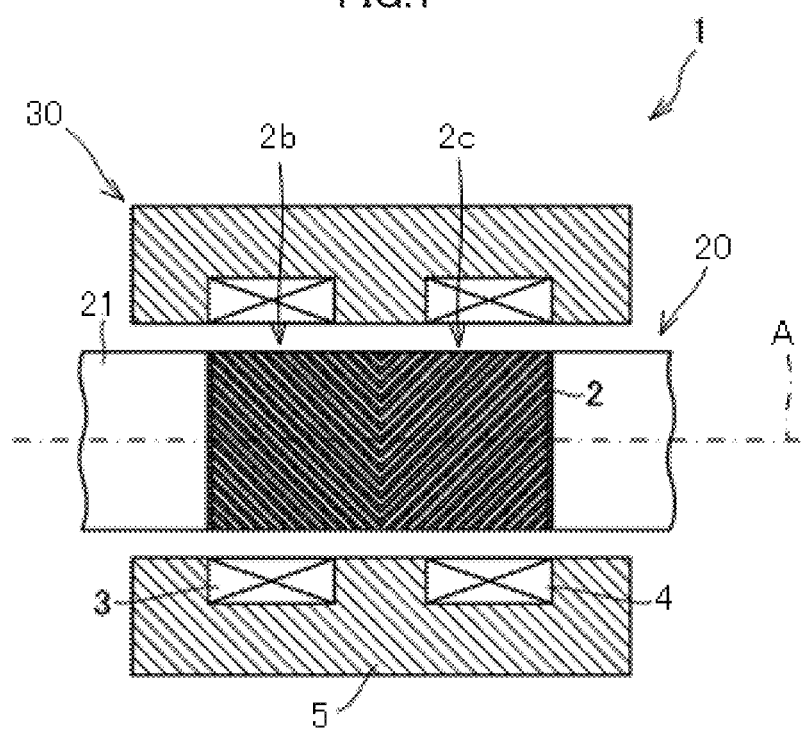
FIG. 1 is a partial cross-sectional view schematically illustrating a configuration of a magnetostrictive sensor according to an embodiment of the present invention.

FIG. 1 is a partial cross-sectional view schematically illustrating a configuration of a magnetostrictive sensor according to an embodiment of the present invention. The following description is directed to a magnetostrictive torque sensor (hereinafter referred to simply as a "torque sensor" in some cases) 1 for detecting a torque acting on a substrate 21 attached to an unillustrated rotating shaft, as an example of a magnetostrictive sensor. FIG. 1 schematically illustrates a configuration of the torque sensor 1 for description.

As illustrated in FIG. 1, the torque sensor 1 includes a magnetic structure 20 including a magnetostrictive film 2 (magnetostrictive portion) and a detection unit 30 including coils 3 and 4. The magnetic structure 20 is formed in a cylindrical shape extending along an axis A. The magnetic structure 20 is disposed on an outer peripheral surface of an unillustrated rotating shaft.

Figure 2:
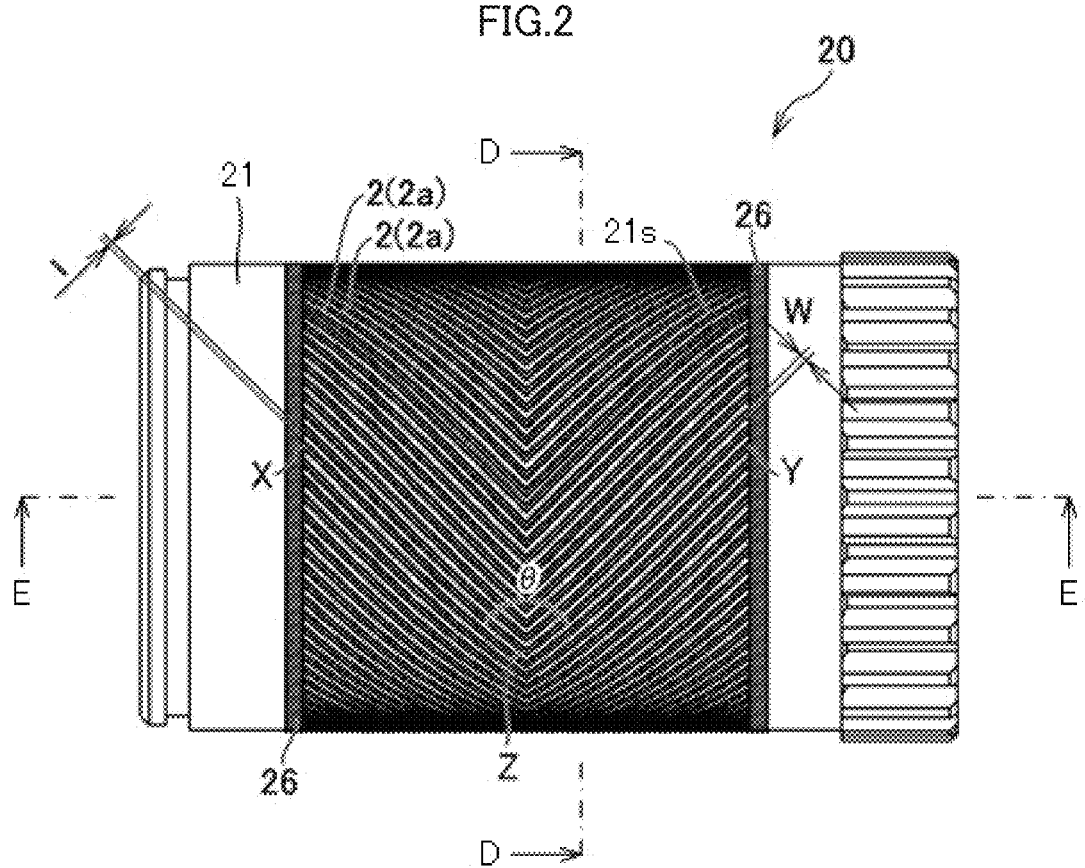
FIG. 2 schematically illustrates a configuration of a magnetic structure.

FIG. 2 schematically illustrates a configuration of the magnetic structure 20. The magnetic structure 20 includes a cylindrical substrate 21 extending along the axis A (i.e., extending axially) and the magnetostrictive film 2. The configuration of the magnetic structure 20 will be described in detail later. As illustrated in FIG. 2, the magnetostrictive film 2 is disposed on an outer peripheral surface 21s of the cylindrical substrate 21. The magnetostrictive film 2 includes a plurality of magnetostrictive lines 2a whose configuration will be described in detail later.

Figure 3:
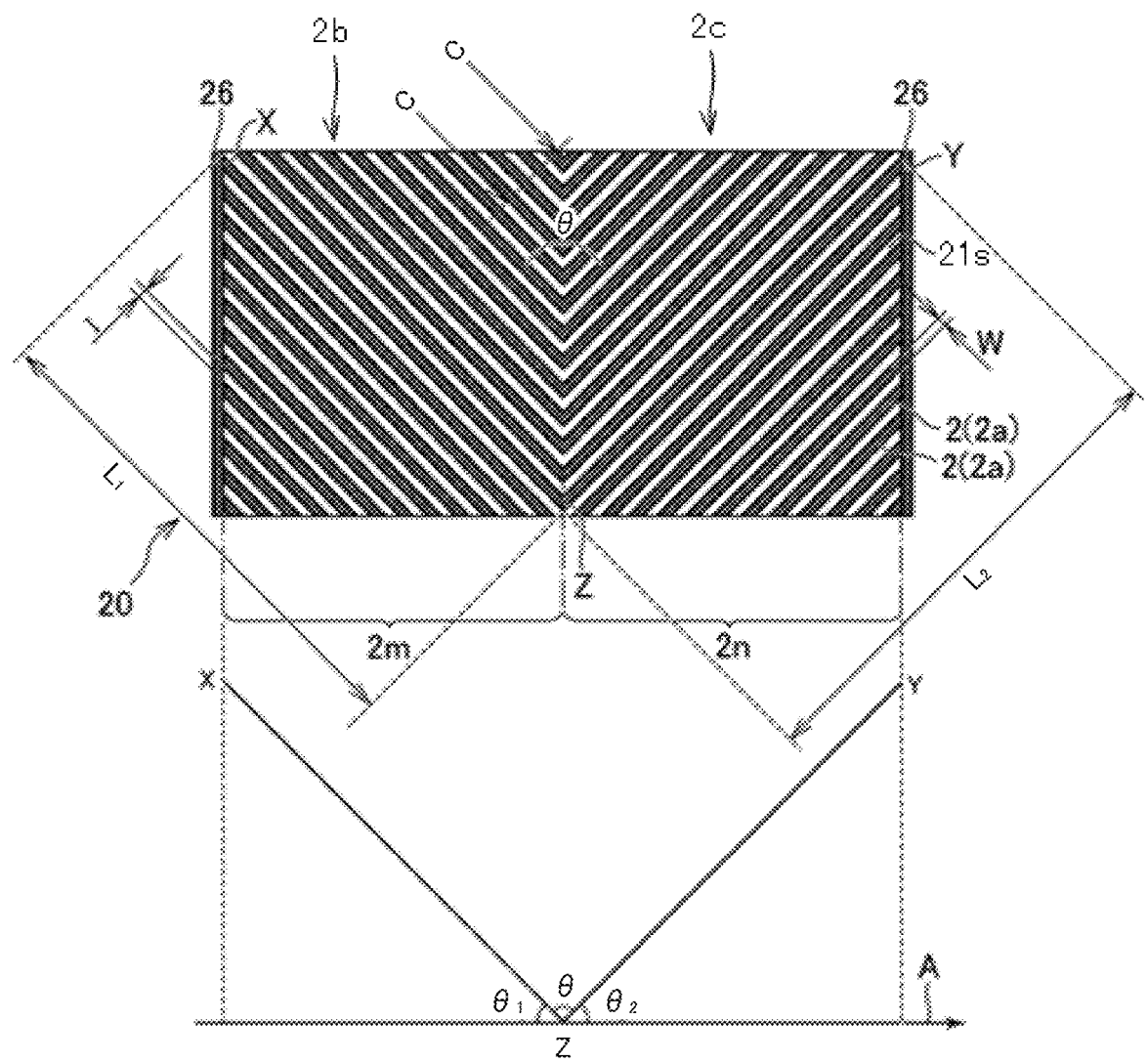
FIG. 3 is a view of a magnetostrictive film seen in a direction orthogonal to an axis of the magnetic structure.

FIG. 3 illustrates the magnetostrictive film 2 of the magnetic structure 20 seen in a direction orthogonal to the axis A (see FIG. 1). The pattern of the magnetostrictive film 2 illustrated in FIG. 3 is an example. As illustrated in FIG. 3, the magnetostrictive film 2 includes the plurality of magnetostrictive lines 2a each having a length of $L=(L_1+L_2)$ (where $L_1=L_2$ in the example of FIG. 3) and a width W. The plurality of magnetostrictive lines 2a extend in directions intersecting the axis A when viewed in the direction orthogonal to the axis A. The direction that a magnetostrictive line 2a extends is referred to as an extension direction of the magnetostrictive line 2a. In FIG. 3, an interspace between adjacent ones of the magnetostrictive lines 2a is expressed as an interspace I.

The magnetostrictive film 2 includes two regions 2b and 2c disposed side by side in the axial direction of the substrate 21. The plurality of magnetostrictive lines 2a are formed across the two regions 2b and 2c. The magnetostrictive lines 2a in one region and the magnetostrictive lines 2a in the other region are symmetric with respect to the center line of the magnetostrictive film 2 in the axial direction. That is, each of the magnetostrictive lines 2a of the magnetostrictive film 2 is formed in a V shape when viewed in the direction orthogonal to the axis A (in the state illustrated in FIG. 3).

With the above-described arrangement of the magnetostrictive lines 2a of the magnetostrictive film 2, when a torsional torque is applied to the substrate 21 through the rotating shaft, one of a tensile force and a compressive force is applied to the magnetostrictive lines 2a in the region 2b of the magnetostrictive film 2 in its extension direction. To the magnetostrictive lines 2a in the region 2c of the magnetostrictive film 2, the other one of the tensile force and the compressive force is applied in the extension direction. In this manner, magnetic permeability varies in the magnetostrictive lines 2a in the regions 2b and 2c of the magnetostrictive film 2.

The detection unit 30 includes the two cylindrical coils 3 and 4 and a yoke 5. As illustrated in FIG. 1, the coils 3 and 4 are disposed to surround the magnetic structure 20. In the example of FIG. 1, the coils 3 and 4 are disposed side by side in the axial direction with respect to the magnetic structure 20. Specifically, as illustrated in FIG. 1, the coils 3 and 4 are disposed with respect to the magnetic structure 20 in such a manner that the coil 3 surrounds one region 2b of the magnetostrictive film 2 and the coil 4 surrounds the other region 2c of the magnetostrictive film 2. The yoke 5 has a recess in which the coils 3 and 4 are disposed. The coils 3 and 4 are disposed inside the tubular yoke 5.

Figure 11:
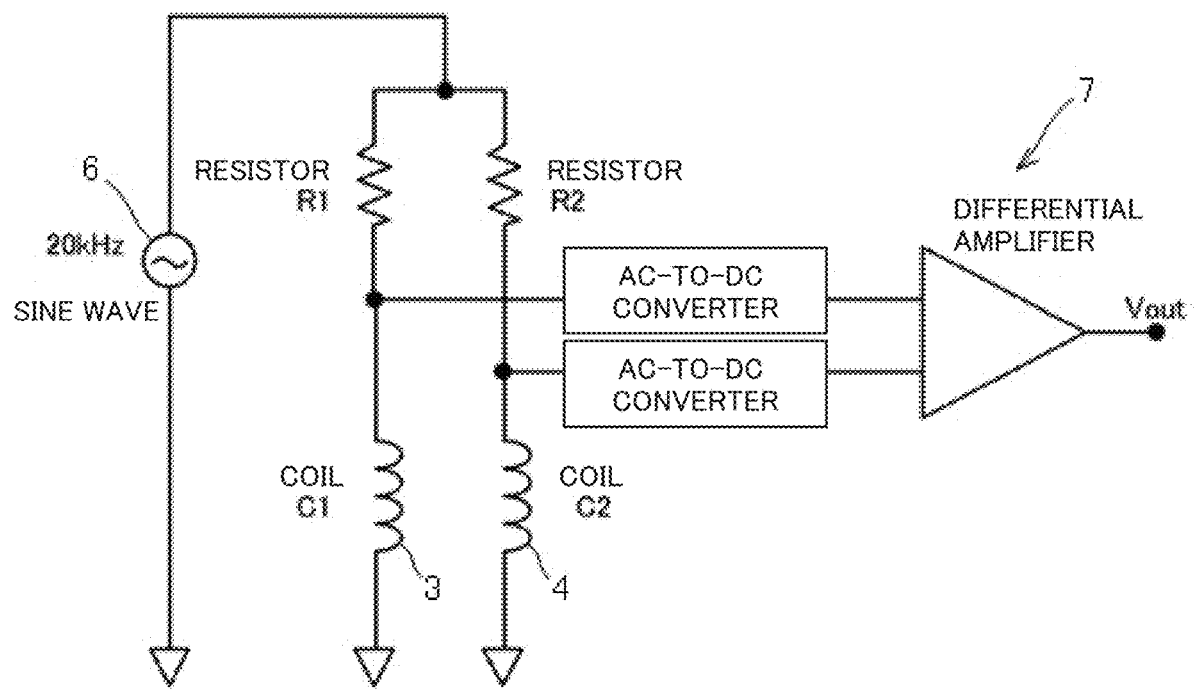
FIG. 11 schematically illustrates a configuration of a circuit for converting an impedance change of a coil to a voltage in the torque sensor illustrated in FIG. 1.

The coils 3 and 4 are connected to an alternating current (AC) power supply 6 as illustrated in FIG. 11 to thereby generate an AC magnetic field around the coils 3 and 4. The coils 3 and 4, the yoke 5, and the substrate 21 constitute a magnetic circuit. As illustrated in FIG. 11, the coils 3 and 4 are also connected to a torque detection circuit 7.

FIG. 11 illustrates an example of a configuration of an electronic circuit included in the torque sensor 1. The circuit configuration illustrated in FIG. 11 is widely known as the electronic circuit included in the torque sensor 1. The circuit illustrated in FIG. 11 includes the AC power supply 6 and the torque detection circuit 7. The AC power supply 6 applies an AC voltage to the coils 3 and 4. The torque detection circuit 7 detects a voltage generated in the coils 3 and 4 to thereby detect a torque generated in the substrate 21. The torque detection circuit 7 obtains a voltage difference $V_{out}$ between the coils 3 and 4 and then, based on the difference $V_{out}$, obtains the torque generated in the substrate 21 by using an unillustrated arithmetic circuit. The electronic circuit included in the torque sensor 1 is not limited to the configuration illustrated in FIG. 11.

As described above, when a torsional torque is applied to the substrate 21 through the rotating shaft, one of a tensile force and a compressive force is applied to the magnetostrictive lines 2a in the regions 2b and 2c of the magnetostrictive film 2 in the torque sensor 1 in the extension direction of the magnetostrictive lines 2a. Thus, a change in magnetic permeability occurring in the magnetostrictive lines 2a differs between the regions 2b and 2c of the magnetostrictive film 2. Such a difference in the magnetic permeability change is detected as a voltage difference between the coils 3 and 4 by the torque detection circuit 7. Thus, the torque detection circuit 7 can detect the torsional torque applied to the substrate 21.

More specifically, when a torque acts on the substrate 21, a tensile stress occurs in the magnetostrictive lines 2a in one of the regions 2b and 2c of the magnetostrictive film 2, and thus, the magnetic permeability of these magnetostrictive lines 2a increases. A compressive stress acts on the magnetostrictive lines 2a in the other region, and thus, the magnetic permeability of these magnetostrictive lines 2a decreases. Consequently, a difference occurs between impedances of the two coils 3 and 4. This impedance difference causes a voltage difference between the coils 3 and 4 that is detected by the torque detection circuit 7 as a value in accordance with the torque acting on the substrate 21. In FIG. 11, suppose $V_{out}$ at a torque of zero is $V_0$ and $V_{out}$ at an input of a rated torque is $V_t$, $V_t$-$V_0$ is an output range of the torque sensor 1.

The arrangement of the components in the torque sensor 1 illustrated in FIG. 1 is an example. The numbers and arrangements, for example, of the coils 3 and 4 and the yoke 5 are not limited to those in the configuration illustrated in FIG. 1, and may be changed as necessary by those skilled in the art.

1.2. Shape of Magnetostrictive Line

The length L/width W of the magnetostrictive lines 2a of the magnetostrictive film 2 illustrated in FIG. 3 satisfies, for example, Expression (2) below. The magnetostrictive lines 2a extend in a first direction intersecting the axis A in the region 2b of the magnetostrictive film 2 when viewed in the direction orthogonal to the axis A. The magnetostrictive lines 2a extend in a second direction intersecting the first direction in the region 2c of the magnetostrictive film 2 when viewed in the direction orthogonal to the axis A. That is, the magnetostrictive lines 2a have bending portions Z each bending at an angle θ, in a center portion of the magnetostrictive film 2 in the axial direction of the substrate 21. The magnetostrictive film 2 is formed to have a coverage percentage defined in Equation (1) of 30% or more and 95% or less.

In the example illustrated in FIG. 3, when viewed in the direction orthogonal to the axis A, the magnetostrictive lines 2a extend from an end X of the magnetostrictive film 2 in the axial direction to the center portion (bending portions Z of the magnetostrictive lines 2a) of the magnetostrictive film 2 in the axial direction across the axis A, in the region 2b of the magnetostrictive film 2. The extension direction of the magnetostrictive lines 2a in the region 2b of the magnetostrictive film 2 corresponds to the first direction described above. When viewed in the direction orthogonal to the axis A, the magnetostrictive lines 2a extend in a direction at an angle θ relative to the first direction, that is, extend from the center portion (bending portions Z of the magnetostrictive lines 2a) of the magnetostrictive film 2 in the axial direction to the other end Y of the magnetostrictive film 2 in the axial direction across the axis A, in the region 2c of the magnetostrictive film 2. The extension direction of the magnetostrictive lines 2a in the region 2c of the magnetostrictive film 2 corresponds to the second direction described above.

As described above, FIG. 3 illustrates an example of the magnetostrictive film 2 in which the magnetostrictive lines 2a have the bending portions Z. Here, the bending portions Z are intersection of first portions 2m (magnetostrictive lines 2a in the region 2b) and second portions 2n (magnetostrictive lines 2a in the region 2c) of the magnetostrictive lines 2a. That is, in the magnetostrictive film 2 illustrated in FIG. 3, each magnetostrictive line 2a includes the first portion 2m extending from one end X of the magnetostrictive film 2 in the axial direction to the bending portion Z and the second portion 2n extending from the bending portion Z to the other end Y of the magnetostrictive film 2 in the axial direction.

coverage percentage=area of region in contact with magnetostrictive film 2 on outer peripheral surface 21s of substrate 21/total area (%) of outer peripheral surface 21s of substrate 21     (1)

30≤length L/width W≤120     (2)

In the magnetostrictive film 2 illustrated in FIG. 3, the length L/width W of the magnetostrictive lines 2a is the sum of the length/width of the magnetostrictive lines 2a in the first portions 2m and the length/width of the magnetostrictive lines 2a in the second portions 2n. The length/width of each magnetostrictive line 2a in the first portion 2m can be obtained by (length $L_1$ of magnetostrictive line 2a from end X to bending portion Z illustrated in FIG. 3)/(width of magnetostrictive line 2a in first portion 2m). The length/width of each magnetostrictive line 2a in the second portion 2n can be obtained by (length $L_2$ of magnetostrictive line 2a from bending portion Z to end Y illustrated in FIG. 3)/(width of magnetostrictive line 2a in second portion 2n).

If the coverage percentage defined by Equation (1) is within the above-described range (30% or more and 95% or less), the torque sensor 1 having high sensitivity can be obtained. That is, in Equation (1), if the coverage percentage is 30% or more, sufficient sensitivity of the torque sensor 1 can be obtained. If the coverage percentage is 95% or less, the shape of the magnetostrictive film 2 does not vary easily. Accordingly, if the coverage percentage is 95% or less, adjacent ones of the magnetostrictive lines 2a do not contact each other, and thus, sufficient sensitivity of the torque sensor 1 can be obtained. The coverage percentage is preferably 50% or more. The coverage percentage is more preferably 60% or more. The coverage percentage is preferably 93% or less. The coverage percentage is more preferably 90% or less. The coverage percentage is much more preferably 85% or less.

Since the length L/width W is within the range defined by Expression (2), the torque sensor 1 having high sensitivity can be obtained. In Expression (2), if the length L/width W is 30 or more, sufficient sensitivity of the torque sensor 1 can be obtained. If the length L/width W is 120 or less, the magnetostrictive film 2 can be easily fabricated. The length L/width W is preferably less than 95. The length L/width W is more preferably less than 85. The length L/width W is preferably 43 or more. The length L/width W is more preferably 53 or more. The length L/width W is much more preferably 75 or more.

From the viewpoint of further increasing sensitivity, in the case where the magnetostrictive line 2a has the bending portion Z, the angle formed by the first direction and the second direction in the bending portion Z of the magnetostrictive line 2a (θ in FIG. 3, i.e., an angle formed by the first portion 2m and the second portion 2n) is preferably 60° or more and 120° or less. The angle is more preferably 80° or more. The angle is preferably 100° or less. In the case where the magnetostrictive line 2a does not have a bending portion, if the angle formed by the first portion 2m and the second portion 2n is within the range described above, sensitivity of the torque sensor 1 can be further increased.

From the viewpoint of further increasing sensitivity of the torque sensor 1, in each magnetostrictive line 2a, the absolute value of an angle $\theta_1$ formed by the axis A and the first direction when viewed in the direction orthogonal to the axis A of the substrate 21 is preferably 30° or more and 60° or less (more preferably the angle $\theta_1$ is ±45°) as illustrated in FIG. 3. The absolute value of an angle $\theta_2$ formed by the substrate 21 and the second direction is preferably 30° or more and 60° or less (more preferably angle $\theta_2$ is ±45°).

The magnetostrictive film 2 illustrated in FIG. 3 further includes connecting parts 26 each connecting ends of adjacent ones of the magnetostrictive lines 2a in the axial direction. In the magnetostrictive film 2 illustrated in FIG. 3, the connecting parts 26 are disposed at both axial ends of the magnetostrictive lines 2a. Since the connecting parts 26 connecting the plurality of magnetostrictive lines 2a are provided in the magnetostrictive film 2, the plurality of magnetostrictive lines 2a are not easily separated from the substrate 21. Thus, strength of magnetostrictive film 2 can be enhanced.

1.3. Cross Section of Magnetic Structure

Figure 4:
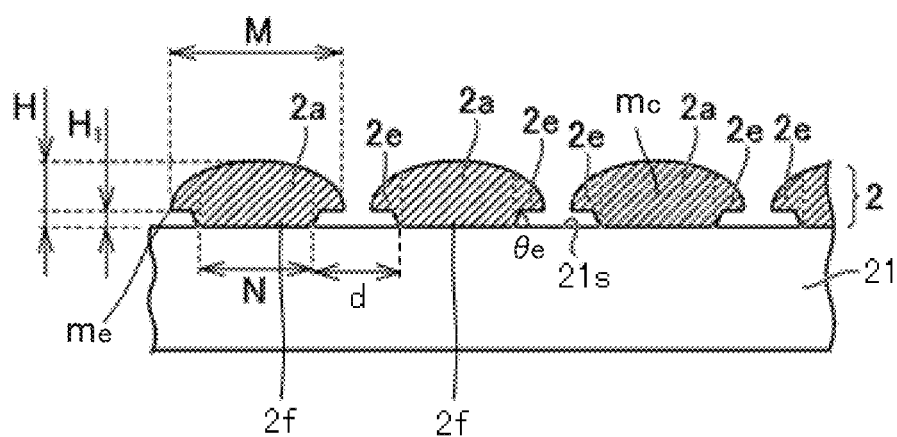
FIG. 4 schematically illustrates a cross section of the magnetic structure.

FIG. 4 schematically illustrates a cross section of the magnetic structure 20 illustrated in FIG. 1. The cross section illustrated in FIG. 4 is obtained by cutting the magnetic structure 20 in a plane orthogonal to the extension direction of the magnetostrictive lines 2a. More specifically, the cross section illustrated in FIG. 4 is a cross section in a case where the magnetostrictive lines 2a are cut in a plane perpendicular to the first direction (i.e., direction from the end X of the magnetostrictive film 2 to the bending portions Z in FIG. 2), that is, a cross section taken along line C-C in FIG. 3 in a direction perpendicularly to the drawing sheet. As illustrated in FIG. 4, the magnetic structure 20 includes the cylindrical substrate 21 and the magnetostrictive film 2 disposed on the outer peripheral surface 21s of the substrate 21. In FIG. 4, "M" corresponds to "W" in FIG. 3.

1.3.1. Magnetostrictive Film

The magnetostrictive film 2 is made of a material including a magnetic material. For example, the magnetic material preferably includes at least one of the metals selected from the group consisting essentially of Ni, Fe, Co, and Cr. In this embodiment, the magnetostrictive film 2 includes a plurality of elements. At least one of the elements is preferably an element forming a ferromagnet, for example. In this case, sensitivity of the torque sensor 1 can be increased. The element forming a ferromagnet is, for example, Fe, Co, or Ni. From the viewpoint of obtaining higher magnetic permeability and higher magnetostrictive effect, the magnetic material more preferably includes Fe and at least one of the metals selected from the group consisting essentially of Ni, Co, and Cr. The magnetostrictive film 2 may include a metal such as Al, Ti, Ge, Mo, Ag, or Cu and/or a nonmetal material such as Si, B, S, C, O, or N.

For example, in a case where the magnetostrictive film 2 contains Fe, from the viewpoint of obtaining higher magnetic permeability and higher magnetostrictive effect, the Fe content (concentration) of the magnetostrictive film 2 is preferably 20 mass % or more and 40 mass % or less. The Fe content is more preferably 23 mass % or more. The Fe content is much more preferably 26 mass % or more. The Fe content is more preferably 36 mass % or less. The Fe content is much more preferably 33 mass % or less. The total content (concentration) of metals except Fe is preferably 60 mass % or more and 80 mass % or less. The total content of metals except Fe is more preferably 64 mass % or more. The total content of metals except Fe is much more preferably 67 mass % or more. The total content of metals except Fe is more preferably 77 mass % or less. The total content of metals except Fe is much more preferably 74 mass % or less. As described above, the metals except Fe preferably include at least one selected from the group consisting essentially of Ni, Co, and Cr.

In a case where the magnetostrictive film 2 contains Fe and Ni, the Ni content (concentration) is preferably 60 mass % or more and 80 mass % or less. The Ni content is more preferably 64 mass % or more. The Ni content is much more preferably 67 mass % or more. The Ni content is more preferably 77 mass % or less. The Ni content is much more preferably 74 mass % or less.

In a case where the magnetostrictive film 2 contains S, the S content (concentration) of the magnetostrictive film 2 is preferably 0.03 mass % or more and 0.12 mass % or less. The S content is more preferably 0.04 mass % or more and 0.10 mass % or less. The S content is much more preferably 0.05 mass % or more and 0.09 mass % or less.

The preferable concentration and more preferable concentration of each element described above refer to concentrations of the element in a center portion $m_c$ of each magnetostrictive line 2a (see FIG. 4). In the cross section illustrated in FIG. 4, the center portion $m_c$ is a center portion of each magnetostrictive line 2a in the thickness direction and the width direction.

The concentration (content) of each element in the magnetostrictive film 2 can be measured with a known element analyzer. Specifically, the concentration of each element can be measured with an electron probe microanalyzer (EPMA), for example. In the case of measuring the concentration of each element with the EPMA, the spot diameter is set at 10 μm or less (preferably 5 μm or less).

The maximum thickness H of the magnetostrictive film 2 (the distance from the surface of the magnetostrictive film 2 contacting the substrate 21, i.e., the outer peripheral surface 21s of the substrate 21, to the tip of projection of the magnetostrictive film 2 outward in the radial direction of the substrate 21) is, for example, 20 μm or more and 200 μm or less. The maximum thickness H is preferably 40 μm or more. The maximum thickness H is more preferably 60 μm or more. The maximum thickness H is preferably 140 μm or less. The maximum thickness H is more preferably 100 μm or less.

As illustrated in FIG. 4, in a cross sectional view of the magnetostrictive lines 2a taken orthogonally to the extension direction of the magnetostrictive lines 2a, the magnetostrictive lines 2a have portions outside in the radial direction of the substrate 21 that are longer than portions of the magnetostrictive lines 2a near the substrate 21, in the direction orthogonal to the radial direction of the substrate 21 (direction parallel to the outer peripheral surface 21s of the substrate 21). Specifically, the magnetostrictive lines 2a have projections 2e individually projecting from bodies of the magnetostrictive lines 2a on the substrate 21 in opposite directions orthogonal to the radial direction of the substrate 21. The presence of the projections 2e of the magnetostrictive lines 2a increases the surface area of the magnetostrictive lines 2a. In addition, the presence of the projections 2e of the magnetostrictive lines 2a can also reduce the amount of change in output of the torque sensor 1 with respect to a change in concentration of each element in the magnetostrictive film 2.

An angle $\theta_e$ formed by the interface between the magnetostrictive lines 2a and the substrate 21 and the projecting direction of the projections 2e is preferably an acute angle (less than 90°). In this case, from the viewpoint of further enhancing sensitivity of the sensor, the angle $\theta_e$ is more preferably greater than 0° and less than or equal to 45°. The angle $\theta_e$ is much more preferably 30° or less.

Since the magnetostrictive lines 2a of the magnetostrictive film 2 have the projections 2e described above, in the cross section illustrated in FIG. 4, the width M at a predetermined distance from the outer peripheral surface 21s of the substrate 21 in the radial direction of the substrate 21 (thickness direction of the magnetostrictive line 2a) is larger than a width N of a contact area 2f between the magnetostrictive film 2 and the outer peripheral surface 21s of the substrate 21.

That is, in the cross sectional view of the magnetostrictive lines 2a taken orthogonally to the extension direction of the of the magnetostrictive lines 2a (i.e., cross section illustrated in FIG. 4: third cross section), the plurality of magnetostrictive lines 2a of the magnetostrictive film 2 have the length of a longest portion (length M at the predetermined distance described above, which will be hereinafter referred to as a maximum width M: first length) that is larger than the length N (second length) of the contact area 2f between the magnetostrictive line 2a and the outer peripheral surface 21s of the substrate 21, in the direction (width direction) orthogonal to the radial direction of the substrate 21. The maximum width M is larger than the length of the interspace d between adjacent magnetostrictive lines 2a. The interspace d (third length) between adjacent magnetostrictive lines 2a refers to an interspace from the contact area 2f (first contact area) between the magnetostrictive line 2a (first magnetostrictive line) and the substrate 21 to the contact area 2f (second contact area) between its adjacent magnetostrictive line 2a (second magnetostrictive line) and the substrate 21.

In the magnetostrictive film 2, the magnetostrictive lines 2a having the shape described above can enhance sensitivity of the torque sensor 1. That is, in the cross sectional view of the magnetostrictive lines 2a taken orthogonally to the extension direction of the magnetostrictive lines 2a, the maximum width M of the magnetostrictive lines 2a in the magnetostrictive film 2 is larger than the length of the interspace d between adjacent magnetostrictive lines 2a. In such a configuration, the interspace d between the magnetostrictive lines 2a is relatively narrow. In such a case where the interspace d between adjacent magnetostrictive lines 2a is narrow, the maximum width M of the magnetostrictive lines 2a can be made larger than the length N of the contact area 2f between the magnetostrictive film 2 and the outer peripheral surface 21s of the substrate 21 so that the surface area of the magnetostrictive lines 2a, that is, the surface area of the magnetostrictive film 2, can be increased. The increase in the surface area of the magnetostrictive film 2 enables the magnetic permeability of the magnetostrictive film 2 to vary in a wide range. In this manner, a change in magnetic permeability upon application of a force to the magnetostrictive film 2 can be easily detected. Thus, sensitivity of the torque sensor 1 can be enhanced.

In other words, with the configuration described above, sensitivity of the torque sensor 1 can be enhanced without changes in the coverage percentage defined in Equation (1) and the value of length L/width W defined in Expression (2).

The length of the interspace d from the contact area 2f between one magnetostrictive line 2a and the outer peripheral surface 21s of the substrate 21 to the contact area 2f between its adjacent magnetostrictive line 2a and the outer peripheral surface 21s of the substrate 21 is larger than the sum of the length of the projection 2e of one magnetostrictive line 2a projecting toward its adjacent magnetostrictive line 2a and the length of the projection 2e of the adjacent magnetostrictive line 2a projecting toward the magnetostrictive line 2a.

In this manner, in adjacent magnetostrictive lines 2a, contact between the projections 2e can be prevented.

In the cross sectional view of the magnetostrictive lines 2a illustrated in FIG. 4, the magnetostrictive lines 2a have a maximum width M larger than the height (maximum thickness, the third length) H of the magnetostrictive lines 2a in the thickness direction (height direction). In this manner, the magnetostrictive lines 2a are formed in a flat shape that is longer in the direction (direction parallel to the outer peripheral surface 21s of the substrate 21) orthogonal to the radial direction of the substrate 21 than in the thickness direction. Accordingly, the surface area of the magnetostrictive lines 2a can be further increased. Thus, a change in magnetic permeability upon application of a force to the magnetostrictive film 2 can be more easily detected.

In the cross section of FIG. 4, from the viewpoint of further enhancing sensitivity of the sensor, the ratio $H_1/H$ between the maximum thickness H of the magnetostrictive line 2a and the height of ends $m_e$ of the magnetostrictive line 2a (distance from the interface between the magnetostrictive line 2a and the substrate 21 to the tip of the projection 2e, i.e., the height from the outer peripheral surface 21s of the substrate 21 to the position of the maximum width M, the first distance) $H_1$ is less than one. The $H_1/H$ is preferably 0.8 or less. The $H_1/H$ is more preferably 0.5 or less. The $H_1/H$ is much more preferably 0.3 or less. On the other hand, the $H_1/H$ is preferably 0.015 or more.

The magnetostrictive lines 2a are formed in such a manner that the ratio $H_1/H$ is within the ranges described above so that the surface area of the magnetostrictive lines 2a can be further increased. Thus, a change in magnetic permeability upon application of a force to the magnetostrictive film 2 can be more easily detected.

By setting $H_1/H$ at 0.5 or less, that is, by setting a half height of the maximum thickness H of the magnetostrictive lines 2a at a position higher than or equal to the maximum width M from the outer peripheral surface 21s of the substrate 21, a portion having a width larger than that of the contact area 2f between the magnetostrictive line 2a and the outer peripheral surface 21s of the substrate 21 can be provided in a wide range in the thickness direction of the magnetostrictive line 2a. Accordingly, the surface area of the magnetostrictive lines 2a can be further increased. Thus, a change in magnetic permeability upon application of a force to the magnetostrictive films 2 can be more easily detected.

1.3.2. Concentration Distribution of Element in Magnetostrictive Film

In this embodiment, the magnetostrictive film 2 has portions having different concentrations of at least one of a plurality of elements. This will be specifically described with reference to the drawings.

Figure 5:
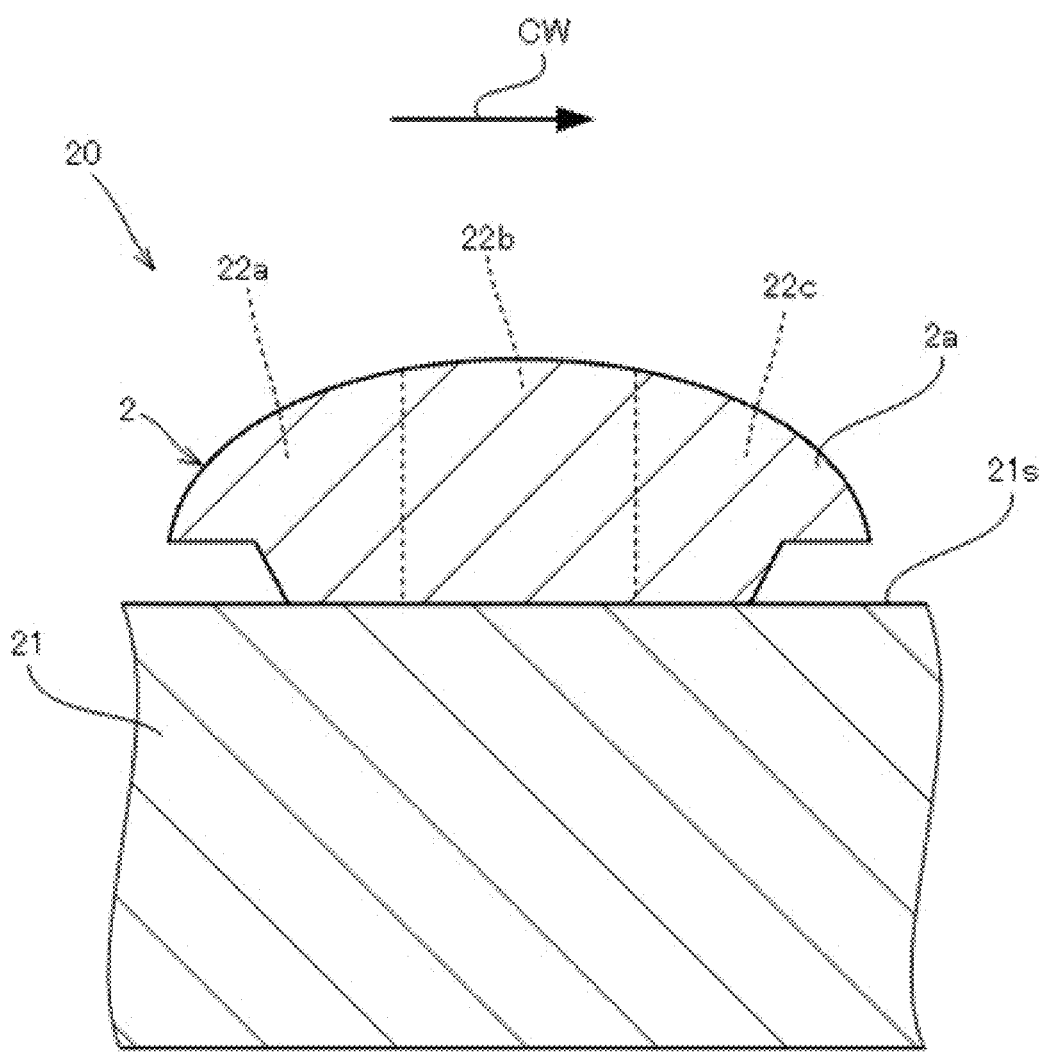
FIG. 5 illustrates a cross section taken along line D-D in FIG. 2.
Figure 6:
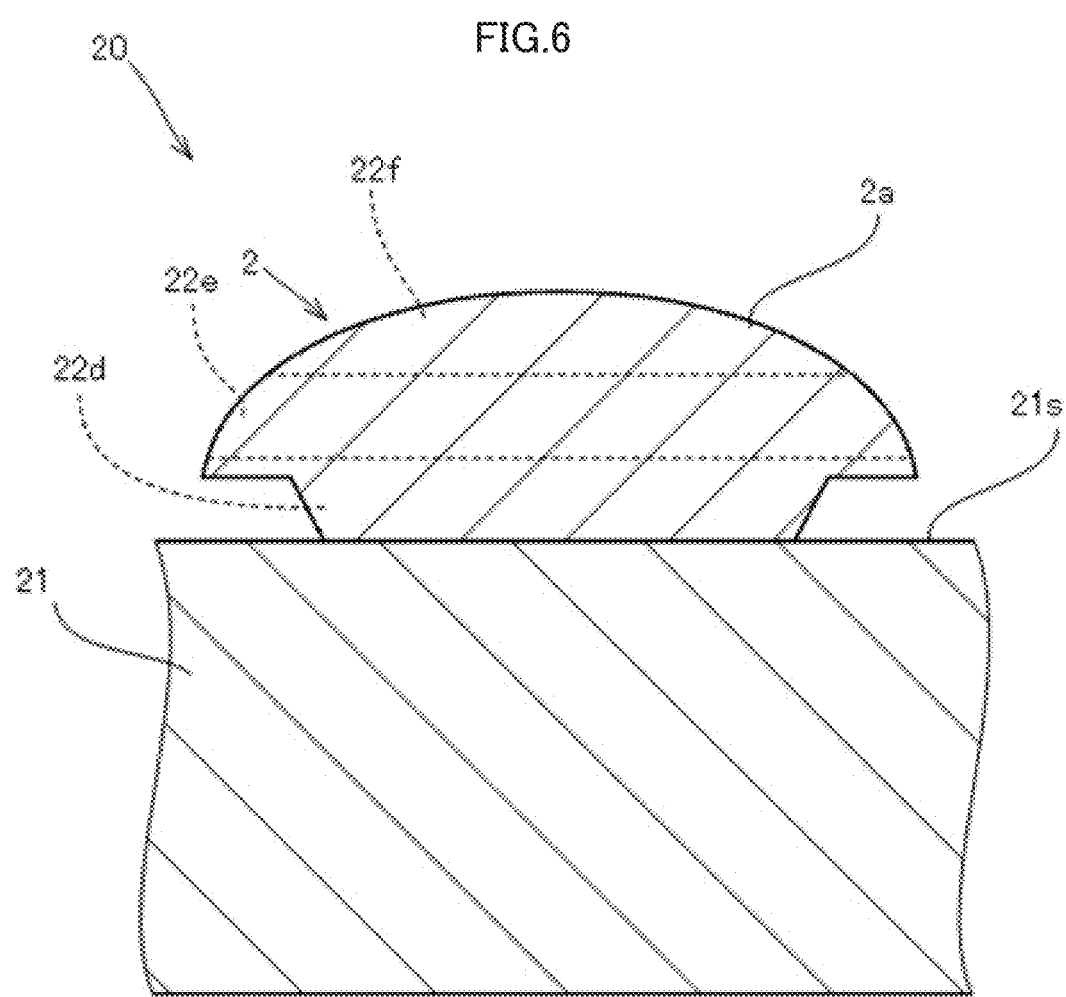
FIG. 6 illustrates another example of the cross section taken along line D-D in FIG. 2.

FIGS. 5 and 6 illustrate cross sections taken along line D-D in FIG. 2 (cross sections orthogonal to the axis A of the magnetic structure 20: hereinafter also referred to as a first cross section). FIGS. 5 and 6 illustrate one of the magnetostrictive lines 2a and its peripheral portion in the D-D cross section of FIG. 2 in an enlarged manner.

With reference to FIG. 5, in the first cross section of the magnetic structure 20, the magnetostrictive line 2a is divided into a plurality of portions 22a, 22b, and 22c that are arranged in a clockwise direction (i.e., direction indicated by an arrow CW in FIG. 5) about the axis A (see FIG. 1), for example. In this case, in this embodiment, the concentration of at least one of a plurality of elements differs between the portion 22a and the portion 22b and also differs between the portion 22b and the portion 22c. That is, in this embodiment, in the first cross section of the magnetic structure 20, portions having different concentrations of the at least one element are arranged clockwise about the axis A.

The concentration of the at least one element may be highest in the portion 22a, highest in the portion 22b, or highest in the portion 22c. The concentration of the at least one element may change in the clockwise direction in each of the portions 22a, 22b, and 22c. In this embodiment, the clockwise direction is a circumferential direction of the substrate 21.

For example, in the first cross section of the magnetic structure 20, the concentration of at least one element may be highest at or near the center of the magnetostrictive line 2a in the clockwise direction and may be lowest at or near an end of the magnetostrictive line 2a in the clockwise direction. Alternatively, in the first cross section of the magnetic structure 20, the concentration of at least one element may be lowest at or near the center of the magnetostrictive line 2a in the clockwise direction and may be highest at or near an end of the magnetostrictive line 2a in the clockwise direction. The difference between the concentration of the at least one element at the center of the magnetostrictive line 2a and the concentration of the at least one element at the end of the magnetostrictive line 2a is preferably 1 mass % or more, and more preferably 2 mass % or more. The concentration difference is, for example, a value less than or equal to the concentration of the at least one element at the center of the magnetostrictive line 2a.

The concentration of the at least one element may be the same in two of the plurality of portions 22a, 22b, and 22c. Suppose the clockwise direction is the lateral direction, the concentration of the at least one element may change to be symmetric in the magnetostrictive line 2a with respect to the center line of the magnetostrictive line 2a in the lateral direction.

The concentration distribution of each element in the magnetostrictive film 2 is not limited to those of the examples described with reference to FIG. 5. For example, as illustrated in FIG. 6, suppose the magnetostrictive line 2a is divided into a plurality of portions 22d, 22e, and 22f in the thickness direction of the magnetostrictive film 2, the concentration of at least one of a plurality of elements may differ between the portion 22d and the portion 22e and differ between the portion 22e and the portion 22f. That is, in the first cross section, portions having different concentrations of the at least one element may be arranged in the thickness direction of the magnetostrictive film 2. Although not described in detail, in a manner similar to that in FIG. 5, a portion having the highest concentration of the at least one element may be any one of the plurality of portions 22d, 22e, and 22f. The concentration of the at least one element may be the same in two of the plurality of portions 22d, 22e, and 22f.

Alternatively, portions having different concentrations of the at least one element may be arranged along the axis A (see FIG. 1), for example. This will be briefly described with reference to the drawings.

Figure 7:
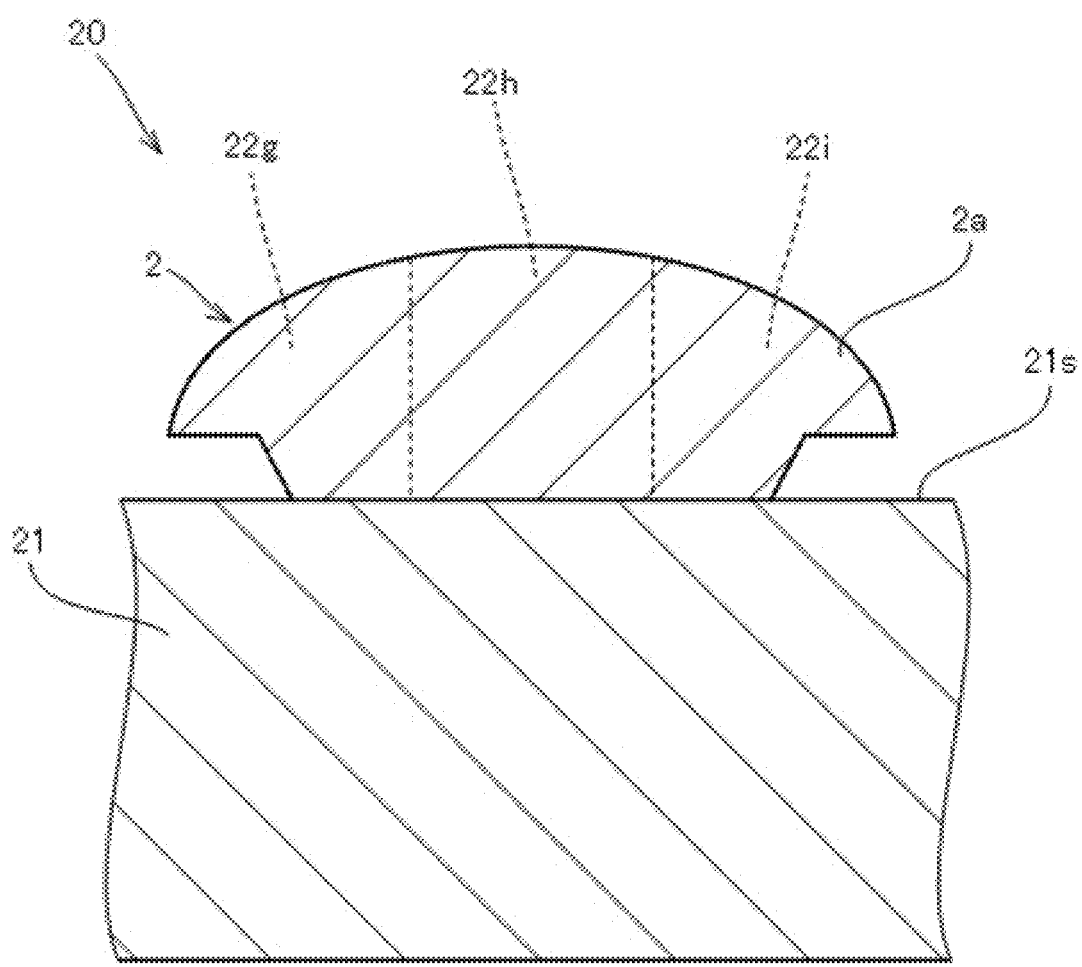
FIG. 7 illustrates a cross section taken along line E-E in FIG. 2.

FIG. 7 illustrates a cross section taken along line E-E in FIG. 2 (cross section orthogonal to the first cross section and passing through the axis A, which will be hereinafter referred to as a second cross section). FIG. 7 illustrates one of the magnetostrictive lines 2a and its peripheral portion in the E-E cross section of FIG. 2 in an enlarged manner.

With reference to FIG. 7, in the second cross section of the magnetic structure 20, suppose the magnetostrictive line 2a is divided into three portions 22g, 22h, and 22i along the axis A (see FIG. 1), for example, the concentration of at least one of a plurality of elements may differ between the portion 22g and the portion 22h and differ between the portion 22h and the portion 22i. Although not described in detail, in a manner similar to that in FIG. 5, a portion having the highest concentration of the at least one element may be any one of the plurality of portions 22g, 22h, and 22i. The concentration of the at least one element may be the same in two of the plurality of portions 22g, 22h, and 22i.

FIG. 5 shows the case where the three portions having different concentrations of at least one element are arranged in the clockwise direction in the magnetostrictive line 2a. Alternatively, in the magnetostrictive line 2a, two or four or more portions having different concentrations of at least one element may be arranged in the clockwise direction. The expression "portions having different concentrations of an element are arranged clockwise about the axis" refers to a situation where portions having different concentrations of an element are present in the clockwise direction. The configuration in which "portions having different concentrations of an element are arranged clockwise about the axis" includes not only a configuration in which the element concentration changes stepwise in the clockwise direction but also a configuration in which the element concentration changes continuously in the clockwise direction.

FIG. 6 shows the case where the three portions having different concentrations of at least one element are arranged in the thickness direction in the magnetostrictive line 2a. Alternatively, in the magnetostrictive line 2a, two or four or more portions having different concentrations of at least one element may be arranged in the thickness direction. The expression "portions having different concentrations of an element are arranged in the thickness direction of the magnetostrictive portion" refers to a situation where portions having different concentrations of an element are present in the thickness direction. The configuration in which "portions having different concentrations of an element are arranged in the thickness direction of the magnetostrictive portion" includes not only a configuration in which the element concentration changes stepwise in the thickness direction but also a configuration in which the element concentration changes continuously in the thickness direction.

FIG. 7 shows the case where the three portions having different concentrations of at least one element are arranged along the axis A (see FIG. 1) in the magnetostrictive line 2a. Alternatively, in the magnetostrictive line 2a, two or four or more portions having different concentrations of at least one element may be arranged along the axis A. The expression "portions having different concentrations of an element are arranged along the axis" refers to a situation where portions having different concentrations of an element are present in the axis direction. The configuration in which "portions having different concentrations of an element are arranged along the axis" includes not only a configuration in which the element concentration changes stepwise in the axis direction but also a configuration in which the element concentration changes continuously in the axis direction.

Although not described in detail, in a manner similar to that in FIG. 8, in the first cross section, for example, a plurality of portions 22j, 22k, 22l, 22m, 22n, and 22o having different concentrations of at least one element may be arranged in a staggered pattern. Similarly, although not shown, in the second cross section, a plurality of portions having different concentrations of at least one element may be arranged in a staggered pattern.

In a region where portions having different concentrations of at least one element are arranged may not extend over the entire region of the magnetostrictive film 2 in the first cross section of the magnetic structure 20. FIG. 9 illustrates a simplified cross section taken along line D-D in FIG. 2 (first cross section). For example, as illustrated in FIG. 9, in the first cross section of the magnetic structure 20, portions having different concentrations of at least one element may be arranged in each of the magnetostrictive lines 2a disposed in separated regions 50a, 50b, 50c, and 50d in the magnetostrictive film 2. In this case, in the magnetostrictive lines 2a in regions except the regions 50a, 50b, 50c, and 50d, the concentration of each of a plurality of elements may be uniform. A region where portions having different concentration of at least one element are arranged preferably occupies ½ or more of the area of the entire magnetostrictive film 2. Similarly, although not shown, in the second cross section of the magnetic structure 20, a region where portions having different concentrations of at least one element may not extend across the entire region of the magnetostrictive film 2. For example, in the second cross section of the magnetic structure 20, portions having different concentrations of at least one element may be arranged in each of the magnetostrictive lines 2a disposed in a plurality of separated regions in the magnetostrictive film 2. In this case, in the magnetostrictive lines 2a in regions except those plurality of separated regions, the concentration of each of a plurality of elements may be uniform.

By adjusting an element concentration in the magnetostrictive film 2 as described above, a stress can be generated inside the magnetostrictive line 2a. In this manner, even if the chemical composition of the magnetostrictive film 2 deviates from a target chemical composition to some degree, sensitivity of the torque sensor 1 can be sufficiently increased. Consequently, it is possible to achieve both an increase in sensitivity of the torque sensor 1 and facilitation of manufacturing of the torque sensor 1. The at least one element is preferably an element forming a ferromagnet, for example. In this case, sensitivity of the torque sensor 1 can be increased.

In the first cross section of the magnetic structure 20 (see FIG. 5), in a case where the magnetostrictive film 2 is formed in such a manner that portions having different concentrations of at least one element are arranged clockwise about the axis A, the magnetostrictive film 2 is formed in the following manner, for example. First, unevenness is formed on an outer peripheral surface 21s of the substrate 21. Specifically, as illustrated in FIG. 10 described later, a resist layer 91 is formed on the outer peripheral surface 21s, for example. Thereafter, a magnetostrictive film 2 is formed by plating on the outer peripheral surface 21s of the substrate 21 on which the resist layer 91 is provided. As described above, in a typical magnetostrictive torque sensor, a magnetostrictive film is formed in such a manner that the concentration of each element is uniform in the entire magnetostrictive film. Thus, in forming a magnetostrictive film by plating with a technique employed to date, plating conditions are adjusted so as to prevent variations in the concentration of each element in the entire magnetostrictive film. Specifically, to prevent variations of concentration of each element, the current density in plating is set at a small value (about 1 to 3 A/dm$^2$). On the other hand, in forming the magnetostrictive film 2 according to this embodiment, the current density in plating is intentionally set at a large value (e.g., 20 A/dm$^2$), for example. In this manner, the magnetostrictive film 2 can be formed in such a manner that portions having different concentrations of at least one element are arranged in the clockwise direction in each of the magnetostrictive line 2a.

Although not described in detail, the magnetostrictive film 2 in which portions having different concentrations of at least one element are arranged in the thickness direction of the magnetostrictive film 2 can be obtained by, for example, changing conditions for forming the magnetostrictive film 2 with time. The magnetostrictive film 2 in which portions having different concentrations of at least one element are arranged along the axis A can be obtained by, for example, changing conditions for forming the magnetostrictive film 2 in the axis direction of the substrate 21.

As described above, since the magnetostrictive lines 2a have the projections 2e, in the cross section illustrated in FIG. 4, the width M at a predetermined distance from the outer peripheral surface 21s of the substrate 21 in the radial direction of the substrate 21 (thickness direction of the magnetostrictive line 2a) is larger than a width N of a contact area 2f between the magnetostrictive film 2 and the outer peripheral surface 21s of the substrate 21. The shape of the magnetostrictive lines 2a described above causes the concentration of the at least one element to be easily changed in the clockwise direction in the magnetostrictive line 2a. More specifically, since the magnetostrictive film 2 has the projections 2e, the concentration of the at least one element can be easily changed without a change in the contact area between the magnetostrictive film 2 and the outer peripheral surface 21s of the substrate 21. The reason why the presence of the projections 2e in the magnetostrictive lines 2a facilitates a change in concentration of at least one element in the clockwise direction in the magnetostrictive lines 2a will be described later.

1.3.2. Substrate

The substrate 21 is made of a material different from that of the magnetostrictive film 2, for example, a material having a magnetic permeability lower than that of the magnetostrictive film 2. The substrate 21 is preferably made of a magnetic material, and is more preferably made of a magnetic material such as Fe, Ni, Co, or Cr. The substrate 21 may contain a metal such as Al, Ti, Ge, Mo, Ag, or Cu and/or a nonmetal material such as Si, B, S, C, O, or N.

1.3.3. Resist Layer

The magnetic structure 20 may further include a resist layer formed on the surface of the magnetostrictive film 2. In this case, the resist layer preferably has a thickness of 45 µm or less.

1.4. Method for Fabricating Magnetic Structure

Figure 10A:
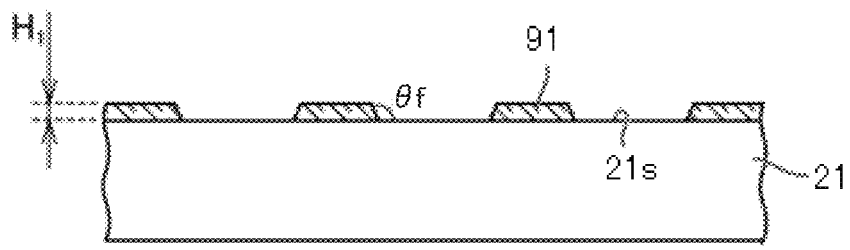
FIGS. 10A and 10B show views for describing a method for fabricating a magnetic structure.
Figure 10B:
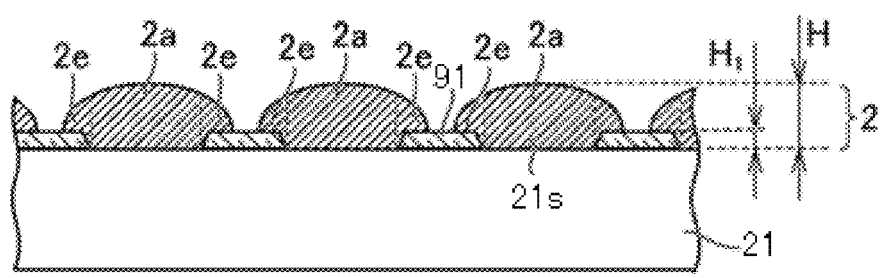

FIGS. 10(a) and 10(b) are views for describing a method for fabricating a magnetic structure 20. FIG. 10 is a cross-sectional view taken along the same plane as that in FIG. 4, and illustrates the substrate 21, the magnetostrictive film 2, the resist layer 91, and so forth in the process of fabricating the magnetic structure 20.

The method for fabricating a magnetic structure 20 includes the step of forming a resist layer 91 having a predetermined pattern on an outer peripheral surface 21s of a substrate 21 and the step of forming a magnetostrictive film 2 on the outer peripheral surface 21s of the substrate 21 on which the resist layer 91 is disposed. The method for fabricating the magnetic structure 20 will now be specifically described.

First, as illustrated in FIG. 10(a), the resist layer 91 having a predetermined pattern is formed on the outer peripheral surface 21s of the substrate 21. This resist layer 91 is used for forming magnetostrictive lines 2a illustrated in FIGS. 1 through 8. The resist layer 91 can be formed by, for example, a known method such as water transfer or screen printing. The thickness of the resist layer 91 is, for example, 3 µm or more and 45 µm or less. To form projections 2e in the magnetostrictive lines 2a, an angle $\theta_f$ formed by the outer peripheral surface 21s of the substrate 21 and an end of the resist layer 91 is preferably an obtuse angle (exceeding 90°).

Next, as illustrated in FIG. 10(b), a magnetostrictive film 2 is formed on the surface of the substrate 21 on which the resist layer 91 is provided. In this step, the magnetostrictive film 2 is formed in such a manner that a height H of the magnetostrictive film 2 exceeds a height $H_1$ of the resist layer 91. The form of the magnetostrictive film 2 may employ a known method such as sputtering, CVD, or plating. Thereafter, a heat treatment is preferably performed at a predetermined temperature (e.g., 300° C. or more and 1000° C. or less) for a predetermined time (e.g., one minute or more and 48 hours or less). In the foregoing manner, the magnetic structure 20 including the magnetostrictive film 2 can be obtained. The heat treatment may be omitted.

With the fabrication method according to this embodiment, after the formation of the resist layer 91 on the surface of the substrate 21, the magnetostrictive film 2 is formed and is subjected to a heat treatment. Thus, the magnetic structure 20 having high sensitivity can be obtained with a simple method and a short process. In addition, fabrication costs of the magnetic structure 20 can be reduced.

In particular, in the case of forming the magnetostrictive film 2 with electroplating, plating is performed in such a manner that the projections 2e are formed as described above so that the concentration of at least one element can be easily changed in the clockwise direction in the magnetostrictive lines 2a. The reason why the concentration of an element can be easily changed will be briefly described as follows.

In general, the composition rate among alloy elements constituting a plating film changes in accordance with a current density in plating. On the other hand, depending on the shape of a member on which a plating film is to be formed (hereinafter referred to as a plating object), the current density can vary in the plating object. For example, in a case where an uneven portion and a corner are formed on the outer surface of the plating object, the current density is higher in projecting portions and corners than in recessed portions. In this embodiment, plating is performed to form the projections 2e. Thus, in the process of forming the magnetostrictive film 2, the current density in portions to be projection 2e (plating film formed on the resist layer 91) increases, in a manner similar to those in the projecting portions and corners. In addition, in performing plating, as the current flowing in the plating object increases, the current densities in the projecting portions and the corners tend to be higher than those in the other portions. In this embodiment, in forming the magnetostrictive film 2 by electroplating, the current density in the plating is intentionally set at a large value (e.g., 20 A/dm$^2$). In this manner, in the process of forming the magnetostrictive film 2, the current density in portions to be projections 2e can be sufficiently higher than those in the other portions. As a result, in the magnetostrictive lines 2a, the composition ratio of alloy elements can be made different between the projections 2e and the other portions. That is, in this embodiment, the presence of the projections 2e in the magnetostrictive lines 2a facilitates a change in the concentration of at least one element in the clockwise direction in the magnetostrictive lines 2a.

After the fabrication of the magnetic structure 20 described above, the magnetostrictive film 2 may be subjected to a process such as polishing or shot peening. In this manner, an internal stress of the magnetostrictive film 2 can be increased.

2. Electric Motor-Assisted Bicycle

An electric motor-assisted bicycle (e.g., a bicycle, a tricycle, or a four-wheel vehicle) according to an embodiment of the present invention includes the torque sensor 1 according to the embodiment described above. In an electric motor-assisted bicycle 10 according to this embodiment, for example, the torque sensor 1 detects a torque generated when an occupant pedals. In the electric motor-assisted bicycle 10, based on the value of the torque detected by the torque sensor 1, driving of an electric motor is controlled.

Figure 12:
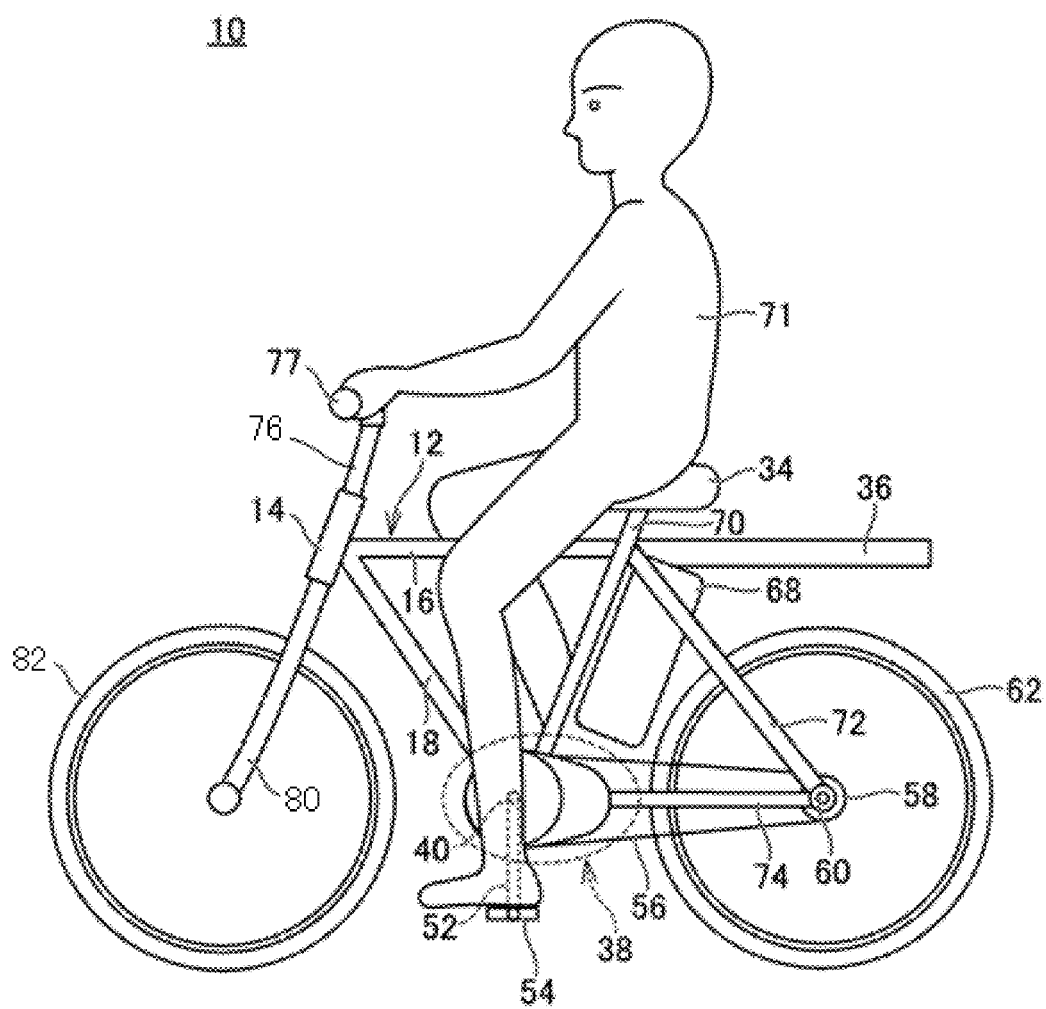
FIG. 12 schematically illustrates a configuration of an electric motor-assisted bicycle.

FIG. 12 schematically illustrates a configuration of the electric motor-assisted bicycle 10 as an example of an electrically assisted vehicle according to the present invention. In FIG. 12, left and right, front and rear, and top and bottom are based on a state in which an occupant 71 sits on a saddle 34 of the electric motor-assisted bicycle 10, facing the handle bar 77 thereof.

As illustrated in FIG. 12, the electric motor-assisted bicycle 10 includes a frame 12. The frame 12 includes a head pipe 14, an upper pipe 16, a front pipe 18, a seat pipe 70, a pair of rear pipes 72, and a pair of lower pipes 74. The upper pipe 16 extends from the head pipe 14 rearward and horizontally. The front pipe 18 extends from the head pipe 14 rearward and obliquely downward. The seat pipe 70 connects the rear end of the upper pipe 16 to the rear end of the front pipe 18. The pair of rear pipes 72 extends from the connecting point between the upper pipe 16 and the seat pipe 70 rearward and obliquely downward. The pair of lower pipes 74 extends from the connecting point between the front pipe 18 and the seat pipe 70 rearward and horizontally. The rear ends of the pair of rear pipes 72 are connected to the rear ends of the pair of lower pipes 74.

In the head pipe 14, a steering shaft 76 for changing the travelling direction of the vehicle is disposed along the head pipe 14. The steering shaft 76 is rotatable in the head pipe 14. The handle bar 77 is attached to the upper end of the steering shaft 76. A pair of left and right front forks 80 is attached to the lower end of the steering shaft 76. A front wheel 82 is attached to the lower end of the front forks 80. The front wheel 82 is rotatable about the center axis of the front wheel 82 supported by the front forks 80. The saddle 34 is disposed at the upper end of the seat pipe 70. A carrier 36 is fixed to the seat pipe 70 and extends rearward therefrom.

Figure 13:
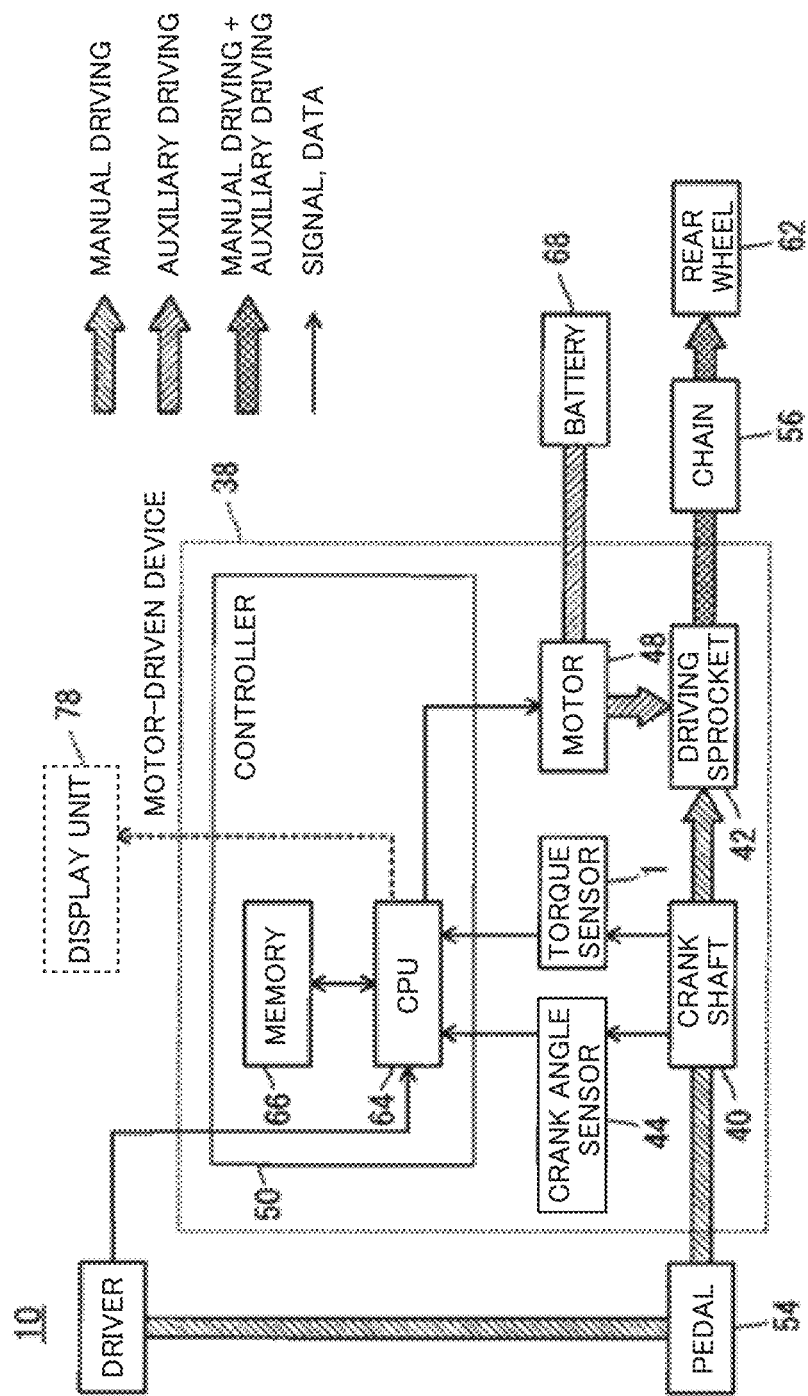
FIG. 13 is a block diagram schematically illustrating a configuration of a motor-driven device.

A motor-driven device 38 is disposed at the connecting point between the front pipe 18 and the seat pipe 70. FIG. 13 schematically illustrates a configuration of the motor-driven device 38 of the electric motor-assisted bicycle 10. The motor-driven device 38 includes the torque sensor 1 according to the embodiment described above. More specifically, as illustrated in FIG. 13, the motor-driven device 38 includes a crank shaft 40, a driving sprocket 42, a crank angle sensor 44, the torque sensor 1, an electric motor 48, and a controller 50. The motor-driven device 38 may be configured to be attachable to a bicycle that is not an electric motor-assisted bicycle or may be configured to be interchangeable with an existing motor-driven device of an electric motor-assisted bicycle.

As illustrated in FIG. 12, the pedal 54 is attached to the crank shaft 40 through a crank 52. The driving sprocket 42 (see FIG. 13) is attached to the outer peripheral surface of the crank shaft 40. The driving sprocket 42 is connected to the rear-wheel sprocket 58 through an endless chain 56. A rear wheel 62 is attached to the rear-wheel sprocket 58 through a rotating shaft 60. The rear wheel 62 is rotatable about the rotating shaft 60.

Although not shown, the crank angle sensor 44 and the torque sensor 1 are disposed near the crank shaft 40. The crank angle sensor 44 detects a crank angle $\theta_c$ that is a rotation angle of the crank shaft 40 rotating by operation of the pedal 54. The torque sensor 1 detects a crank torque $\tau$ that is a torque applied to the crank shaft 40. The electric motor 48 generates an auxiliary driving force to be applied to the driving sprocket 42.

The controller 50 includes a CPU 64 and a memory 66. The CPU 64 performs a necessary computation and controls operations of the electric motor 48 and the electric motor-assisted bicycle 10. The memory 66 as a storage unit is constituted by, for example, an EEPROM, and stores programs and data for controlling an operation of the electric motor-assisted bicycle 10, computation data, and so forth. The memory 66 stores an assist pattern.

A battery 68 constituted by a battery (e.g., a secondary battery such as a nickel (Ni)-cadmium (Cd) battery) for supplying electric power to the electric motor 48 is attached to the seat pipe 70. The CPU 64 of the controller 50 receives the crank angle $\theta_c$ output from the crank angle sensor 44 and the crank torque ti output from the torque sensor 1. These data items are stored in the memory 66.

Based on the crank angle $\theta_c$ and the crank torque $\tau$, the CPU 64 controls an auxiliary driving force generated by the electric motor 48.

The electric motor-assisted bicycle 10 according to this embodiment includes the torque sensor 1 according to the embodiment described above that can accurately detect a torque with high sensitivity, and thus, the electric motor-assisted bicycle 10 can travel with stability.

Advantages of Embodiment

In this embodiment, the magnetostrictive film (magnetostrictive portion) 2 satisfies at least one of requirements (a), (b), and (c) described later. Thus, a stress can be generated inside the magnetostrictive film 2. Consequently, sensitivity of the torque sensor 1 can be sufficiently increased even if the chemical composition of a material constituting the magnetostrictive film 2 deviates to some degree from a target chemical composition. That is, it is possible to achieve both an increase in sensitivity of the torque sensor 1 and facilitation of manufacturing of the torque sensor 1. Thus, the torque sensor 1 having high sensitivity can be efficiently manufactured.

(a) In the first cross section of the magnetic structure 20, portions having different concentrations of at least one element are arranged clockwise about the axis A.

(b) In the first cross section of the magnetic structure 20, portions having different concentrations of at least one element are arranged in the thickness direction of the magnetostrictive film 2.

(c) In the second cross section of the magnetic structure 20, portions having different concentrations of at least one element are arranged along the axis A.

The magnetostrictive film 2 may satisfy two or more of conditions (a), (b), and (c) described above. In this case, a stress can also be generated inside the magnetostrictive film 2. Thus, the torque sensor 1 having high sensitivity can be efficiently manufactured.

In this embodiment, the torque sensor 1 includes the tubular substrate 21 extending along the axis A and the magnetostrictive film 2 formed on the outer peripheral surface 21s of the substrate 21. The magnetostrictive film 2 includes the plurality of magnetostrictive lines 2a each extending linearly. In at least some of the magnetostrictive lines 2a, when the magnetostrictive lines 2a including some of the magnetostrictive lines 2a are viewed in a cross section taken orthogonally to the extension direction of the magnetostrictive lines 2a, the length M of a longest portion of one of the magnetostrictive lines 2a is larger than the length N of a contact area 2f between the one of the magnetostrictive lines 2a and the outer peripheral surface 21s of the substrate 21, and is larger than the length of the interspace d between the contact area 2f and another contact area 2f, in a direction parallel to the outer peripheral surface 21s of the substrate 21. The another contact area 2f is between one of the magnetostrictive lines 2a adjacent to the one of the magnetostrictive lines 2a and the outer peripheral surface 21s of the substrate 21 (i.e., the interspace d between adjacent ones of the magnetostrictive lines 2a).

In this embodiment, in the cross sectional view of the magnetostrictive lines 2a taken orthogonally to the extension direction of the magnetostrictive lines 2a, the length M of the longest portion of each of the magnetostrictive lines 2a in the direction parallel to the outer peripheral surface 21s of the substrate 21 is larger than the length of the interspace d between adjacent ones of the magnetostrictive lines 2a. Thus, the interspace d between the magnetostrictive lines 2a is relatively narrow. In this configuration in which the interspace d between the adjacent magnetostrictive lines 2a is narrow, the length M of the longest portion is made larger than the length N of the contact area 2f between each magnetostrictive line 2a and the outer peripheral surface 21s of the substrate 21 so that the surface area of the magnetostrictive lines 2a can be increased. Thus, a change in magnetic permeability upon application of a force to the magnetostrictive film 2 can be easily detected. As a result, sensitivity of the torque sensor 1 can be enhanced under dimensional constraints on the magnetostrictive film 2.

In the at least some of the plurality of magnetostrictive lines 2a, when the magnetostrictive lines 2a including the some of the magnetostrictive lines 2a are viewed in the cross section taken orthogonally to the extension direction of the magnetostrictive lines 2a, the length M of the longest portion is larger than the maximum thickness H of the magnetostrictive lines 2a.

Thus, in the at least some of the plurality of magnetostrictive lines 2a, when the magnetostrictive lines 2a including the some of the magnetostrictive lines 2a are viewed in the cross section taken orthogonally to the extension direction of the magnetostrictive lines 2a, each of the magnetostrictive lines 2a is formed in a flat shape that is longer in the direction parallel to the outer peripheral surface 21s of the substrate 21 than in the thickness direction of the magnetostrictive line 2a. Accordingly, the surface area of the magnetostrictive lines 2a can be further increased. Thus, a change in magnetic permeability upon application of a force to the magnetostrictive film 2 can be more easily detected.

As a result, sensitivity of the torque sensor 1 can be further enhanced under dimensional constraints on the magnetostrictive film 2.

In the at least some of the plurality of magnetostrictive lines 2a, when the magnetostrictive lines 2a including the some of the magnetostrictive lines 2a are viewed in the cross section taken orthogonally to the extension direction of the magnetostrictive lines 2a, the maximum thickness H of each of the magnetostrictive lines 2a is larger than the height $H_1$ in the thickness direction from the outer peripheral surface 21s of the substrate 21 to the longest portion of the magnetostrictive lines 2a.

Thus, in the at least some of the plurality of magnetostrictive lines 2a, when the magnetostrictive lines 2a including the some of the magnetostrictive lines 2a are viewed in the cross section taken orthogonally to the extension direction of the magnetostrictive lines 2a, a portion wider than the contact area 2f with the outer peripheral surface 21s of the substrate 21 can be formed. Accordingly, the surface area of the magnetostrictive lines can be increased, as compared to magnetostrictive lines not having a portion wider than the contact area 2f with the outer peripheral surface 21s of the substrate 21. Thus, a change in magnetic permeability upon application of a force to the magnetostrictive film 2 can be easily detected. As a result, sensitivity of the torque sensor 1 can be further enhanced under dimensional constraints on the magnetostrictive film 2.

In the at least some of the plurality of magnetostrictive lines 2a, when the magnetostrictive lines 2a including the some of the magnetostrictive lines 2a are viewed in the cross section taken orthogonally to the extension direction of the magnetostrictive lines 2a, a half of the maximum thickness H of the magnetostrictive lines 2a is greater than or equal to the height $H_1$ in the thickness direction from the outer peripheral surface 21s of the substrate 21 to the longest portion of the magnetostrictive lines 2a.

In this manner, in the at least some of the plurality of magnetostrictive lines 2a, when the magnetostrictive lines 2a including the some of the magnetostrictive lines 2a are viewed in the cross section taken orthogonally to the extension direction of the magnetostrictive lines 2a, a portion longest in the direction parallel to the outer peripheral surface 21s of the substrate 21 can be formed in a wider range in the thickness direction of the magnetostrictive lines 2a. Accordingly, the surface area of the magnetostrictive lines can be further increased. Thus, a change in magnetic permeability upon application of a force to the magnetostrictive film 2 can be more easily detected.

In the at least some of the plurality of magnetostrictive lines 2a, when the magnetostrictive lines 2a including the some of the magnetostrictive lines 2a are viewed in the cross section taken orthogonally to the extension direction of the magnetostrictive lines 2a, the length of the interspace d from the contact area 2f of one of the magnetostrictive lines 2a and the contact area 2f between one of the magnetostrictive lines 2a adjacent to the one of the magnetostrictive lines 2a and the outer peripheral surface 21s of the substrate 21 is larger than the sum of the length of the longest portion projecting from the contact area 2f toward the adjacent magnetostrictive line 2a and the length of the longest portion of the adjacent magnetostrictive line 2a from the contact area 2f between the adjacent magnetostrictive line 2a and the substrate 21 toward the one of the magnetostrictive lines 2a, in the direction parallel to the outer peripheral surface 21s of the substrate 21.

In this manner, in adjacent magnetostrictive lines 2a, contact between the longest portions can be prevented.

The magnetostrictive film 2 includes the connecting parts 26 connecting the plurality of magnetostrictive lines 2a. With this configuration, the magnetostrictive lines 2a are not easily separated from the substrate 21. Thus, strength of the magnetostrictive film 2 can be enhanced.

The torque sensor 1 further includes the coils 3 and 4 disposed to surround the magnetostrictive film 2. Accordingly, a change in magnetic permeability occurring in the magnetostrictive film 2 can be detected based on a change in impedance of the coils 3 and 4.

The plurality of coils 3 and 4 are arranged side by side along the axis A. The plurality of coils 3 and 4 ensure detection of a change in magnetic permeability of the magnetostrictive film 2. Accordingly, detection accuracy of the torque sensor 1 can be enhanced.

Other Embodiments

The embodiment of the present invention has been described above, but the embodiment is merely an example for carrying out the invention. Thus, the invention is not limited to the embodiment, and the embodiment may be modified as necessary within a range not departing from the gist of the invention.

In the embodiment, as illustrated in FIG. 3, a connecting part 26 connecting ends of adjacent magnetostrictive lines 2a is provided at each axial end of the magnetostrictive lines 2a, but the position of the connecting part is not limited to the example described above. For example, the connecting part may be provided to connect bending portions Z of adjacent ones of the magnetostrictive lines 2a. Alternatively, for example, a connecting part connecting adjacent ones of magnetostrictive lines 2a in a center portion of the first portion 2m and a connecting part connecting adjacent ones of the magnetostrictive lines 2a in a center portion of the second portion 2n may be provided. The magnetostrictive film may include no connecting parts.

In the embodiment, a plurality of magnetostrictive lines 2a are formed around the entire circumference of the outer peripheral surface 21s of the substrate 21. However, a plurality of magnetostrictive lines 2a may be provided only on a part of the outer peripheral surface 21s of the substrate 21.

In the embodiment, the plurality of magnetostrictive lines 2a are formed at regular intervals. However, the interval between adjacent magnetostrictive lines in the magnetostrictive film may not be uniform. In the embodiment, the plurality of magnetostrictive lines 2a are formed to have a uniform width W. However, the width of the plurality of magnetostrictive lines in the magnetostrictive film may not be uniform.

In the embodiment, each of the magnetostrictive lines 2a includes the bending portion Z that connects the first portion 2m and the second portion 2n together. However, each magnetostrictive line may include no bending portion. For example, instead of the bending portion Z, a gap may be provided so that the first portion and the second portion are separated from each other in the magnetostrictive line.

In the embodiment, the length $L_1$ of the first portion 2m and the length $L_2$ of the second portion 2n constituting the magnetostrictive line 2a may be equal. However, the length of the first portion and the length of the second portion may differ from each other.

Figure 14:
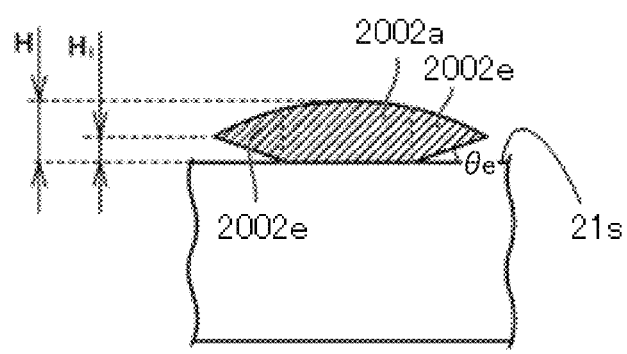
FIG. 14 is a cross section illustrating another example of the magnetic structure.
Figure 15:
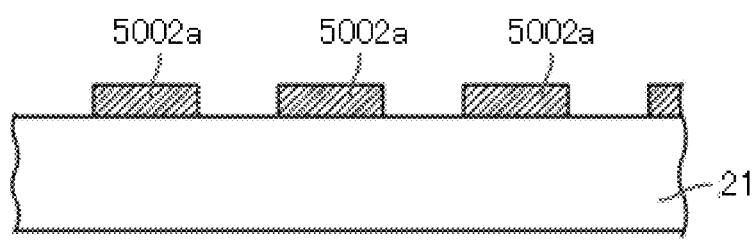
FIG. 15 is a cross section illustrating yet another example of the magnetic structure.

The shape of the magnetostrictive lines is not limited to the example described above. Each of FIGS. 14 and 15 is a cross-sectional view (cross-sectional view taken along a plane orthogonal to the extension direction of the magnetostrictive lines 2a) illustrating another example of the magnetic structure by using a cross section similar to that of FIG. 4. FIG. 14 illustrates a case where the angle $\theta_e$ formed by the outer peripheral surface 21s of the substrate 21 and the projection direction of projections 2002e of a magnetostrictive line 2002a and the ratio $H_1/H$ are different from those of the example illustrated in FIG. 4. FIG. 15 illustrates a case where magnetostrictive lines 5002a have rectangular cross sections.

Figure 16:
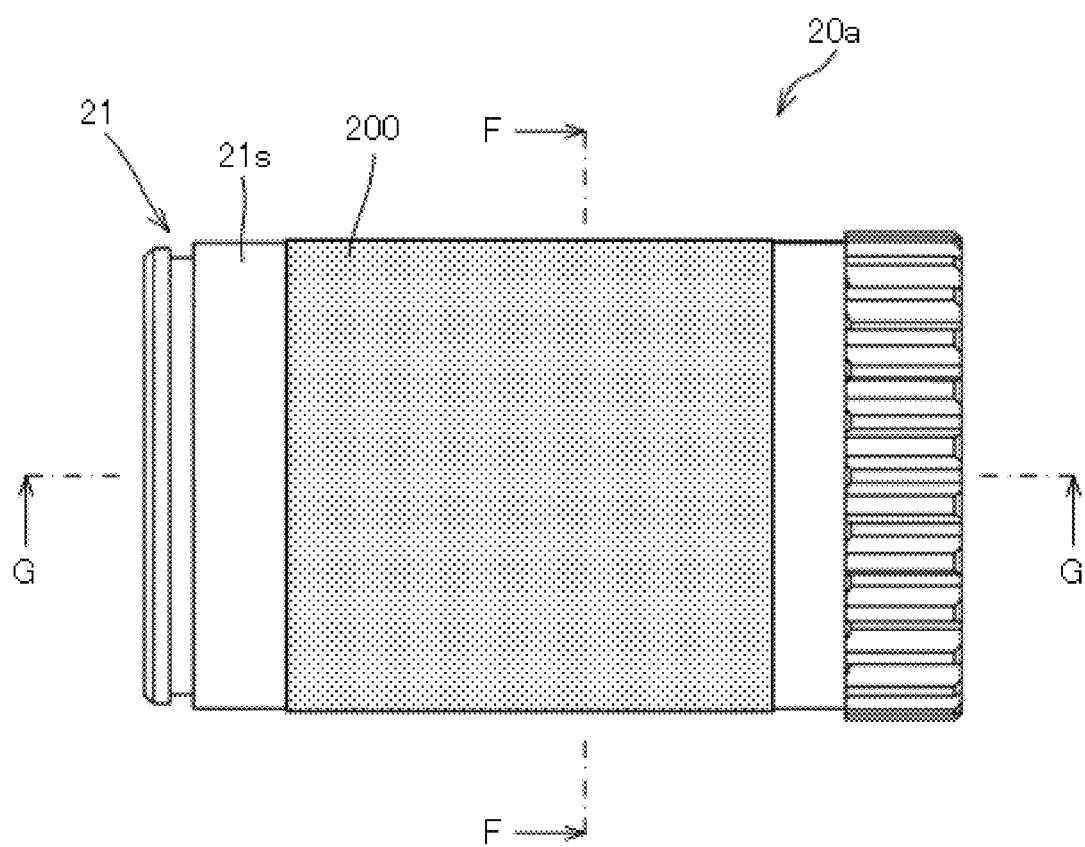
FIG. 16 illustrates still another example of the magnetic structure.

The embodiment is directed to the magnetic structure 20 including the magnetostrictive film 2 having the plurality of magnetostrictive lines 2a. However, the magnetostrictive film may not include a plurality of magnetostrictive lines. FIG. 16 illustrates another example of the magnetic structure. In a magnetic structure 20a illustrated in FIG. 16, the magnetostrictive film 200 is formed over the entire periphery of the substrate 21 so as not to form a gap therebetween. In the magnetic structure 20a illustrated in FIG. 16, in a manner similar to the magnetic structure 20, the magnetostrictive film (magnetostrictive portion) 200 has portions having different concentrations of at least one of a plurality of elements. Specifically, the magnetostrictive film 200 satisfies at least one of requirements (a1), (b1), and (c1) described below. Thus, in a manner similar to the embodiment, a stress can be generated inside the magnetostrictive film 200.

(a1) In the first cross section of the magnetic structure 20a, portions having different concentrations of at least one element are arranged clockwise about the axis A.

(b1) In the first cross section of the magnetic structure 20a, portions having different concentrations of at least one element are arranged in the thickness direction of the magnetostrictive film 2.

(c1) In the second cross section of the magnetic structure 20a, portions having different concentrations of at least one element are arranged along the axis A.

The first cross section of the magnetic structure 20a refers to a cross section orthogonal to the axis of the magnetic structure 20a (e.g., cross section taken along line F-F in FIG. 16). The second cross section of the magnetic structure 20a refers to a cross section orthogonal to the first cross section of the magnetic structure 20a and passing through the axis of the magnetic structure 20a (e.g., cross section taken along line G-G in FIG. 16).

In the embodiment, the configuration of this embodiment is applied to the torque sensor 1 as an example of the magnetostrictive sensor. The configuration of this embodiment, however, may be applied to other sensors such as a load sensor as long as the sensor includes a magnetostrictive film. Similarly, the configuration of the embodiment may be applied not only to a torque sensor for use in an electric motor-assisted bicycle but also sensors for other purposes. In the case of applying the configuration of the embodiment to a load sensor, one coil is disposed to surround the magnetostrictive film.

In the embodiment, the substrate 21 is cylindrical. The substrate, however, may have any cross-sectional shape as long as the substrate is columnar. For example, the outer peripheral surface of the substrate may have a polygonal shape in cross section. The substrate may be hollow or solid.

In the embodiment, the magnetostrictive lines 2a of the magnetostrictive film 2 extend in lines. However, at least a part of the plurality of island-shape magnetostrictive portions may be connected together in lines. The plurality of magnetostrictive lines 2a may not be parallel to one another as long as the magnetostrictive lines 2a are not in contact with one another.

In the embodiment, the plurality of magnetostrictive lines 2a of the magnetostrictive film 2 have the same cross section as that illustrated in FIG. 4 across the extension direction thereof. However, the cross sections of the magnetostrictive lines 2a may differ from one another in each of the magnetostrictive lines 2a in the extension direction thereof. All the plurality of magnetostrictive lines 2a do not need to have the same cross-sectional shape.

In the embodiment, in the cross section taken orthogonally to the extension direction of the magnetostrictive lines 2a, the magnetostrictive lines 2a have the projections 2e projecting to opposite directions parallel to the outer peripheral surface 21s of the substrate 21. The magnetostrictive lines 2a, however, may have projections projecting in one direction parallel to the outer peripheral surface 21s of the substrate 21.

In this embodiment, in the cross section of the magnetostrictive lines 2a taken orthogonally to the extension direction thereof, the length M of the longest portion in the direction parallel to the outer peripheral surface 21s of the substrate 21 is larger than the maximum thickness H of the magnetostrictive lines 2a. In the magnetostrictive lines 2a, however, the length M of the longest portion may be less than or equal to the maximum thickness H.

In the embodiment, in the cross section of the magnetostrictive lines 2a taken orthogonally to the extension direction thereof, a half of the maximum thickness H of the magnetostrictive lines 2a is greater than or equal to the height $H_1$ in the thickness direction from the outer peripheral surface 21s of the substrate 21 to the longest portion of the magnetostrictive lines 2a. In the magnetostrictive lines 2a, however, the half of the maximum thickness H may be smaller than the height $H_1$.

EXAMPLES

Examples of the present invention will now be described, but the invention is not limited to the examples below.

First Example

With the fabrication method illustrated in FIG. 10, a plurality of magnetic structures 20 each including the magnetostrictive film 2 having the magnetostrictive lines 2a illustrated in FIG. 3 and the cross section illustrated in FIG. 4 and formed by plating were obtained. The plating was performed with a known Ni—Fe alloy bath (Watts bath) of nickel sulfate, nickel chloride, iron sulfate (II), boric acid, or the like. Plating conditions were pH3, a bath temperature of 55° C., and a current density of 5 to 20 A/dm². The plating was performed with the substrate 21 being circumferentially rotated at 3 rpm, and thereby a uniform thickness of the resulting plating film (magnetostrictive film 2) was obtained.

In each of the magnetic structures 20 obtained by the method described above, the magnetostrictive lines 2a in cross section (FIG. 4) had a maximum thickness H of 85 μm, an angle $\theta_e$ of 30°, a width M of 460 μm, a length N in an interface with the substrate 21 of 260 μm, a proportion of contact with the magnetostrictive lines 2a on the surface of the substrate 21 (coverage percentage) of 40%, and a length of an interspace I between adjacent magnetostrictive lines 2a of 200 μm.

The obtained magnetostrictive film 2 was a Fe—Ni alloy. The magnetostrictive film 2 had a Fe concentration of about 30 mass % and a Ni concentration of about 70 mass %. A material for the substrate 21 was SCM435 (JIS G4053).

The magnetostrictive film 2 was formed in such a manner that the Fe concentration (mass %) changes in the circumferential direction of the substrate 21. Specifically, the magnetostrictive film 2 was formed in such a manner that the Fe concentration in the center portion of the magnetostrictive lines 2a in the circumferential direction is lower than the Fe concentration at each circumferential end of the magnetostrictive lines 2a. A plurality of magnetostrictive films 2 showing various differences between the Fe concentration in the center portion of the magnetostrictive lines 2a and the Fe concentration at each end of the magnetostrictive lines 2a (hereinafter referred to as a Fe concentration difference) were produced. Specifically, the produced magnetic structures 20 include a plurality of magnetic structures 20 each including a magnetostrictive film 2 having a Fe concentration difference (mass %) of about 2%, a plurality of magnetic structures 20 each including a magnetostrictive film 2 having a Fe concentration difference of about 3%, a plurality of magnetic structures 20 each including a magnetostrictive film 2 having a Fe concentration difference of about 4.5%, a plurality of magnetic structures 20 each including a magnetostrictive film 2 having a Fe concentration difference of about 5%, a plurality of magnetic structures 20 each including a magnetostrictive film 2 having a Fe concentration difference of about 7%, and a plurality of magnetic structures 20 each including a magnetostrictive film 2 having a Fe concentration difference of about 8%. The magnetic structures 20 including the magnetostrictive films 2 having Fe concentration differences of about 2%, about 3%, and about 4.5% were subjected to a heat treatment at 600° C. for one hour. On the other hand, the magnetic structures 20 including the magnetostrictive films 2 having Fe concentration differences of about 5%, about 7%, and about 8% were subjected to a heat treatment at 500° C. for one hour.

Figure 17:
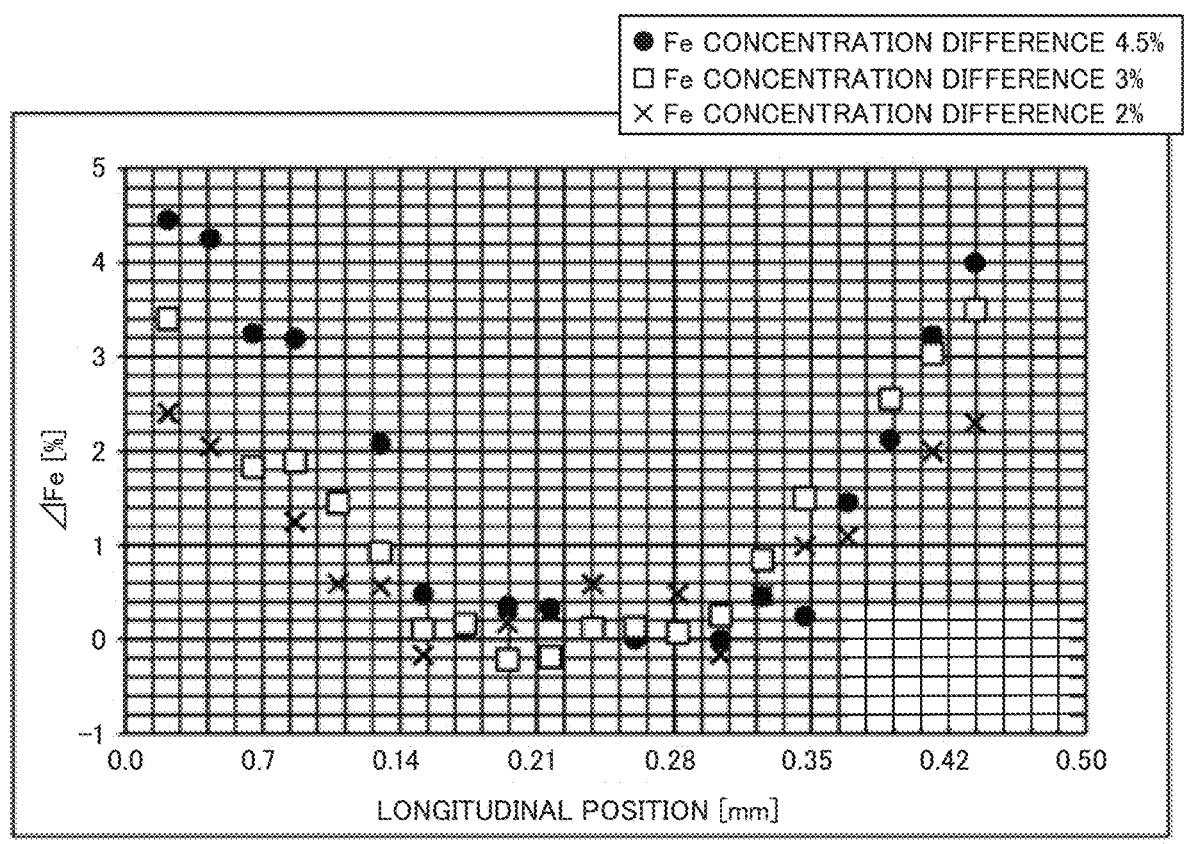
FIG. 17 is a graph showing change in Fe concentrations in magnetostrictive lines.
Figure 18:
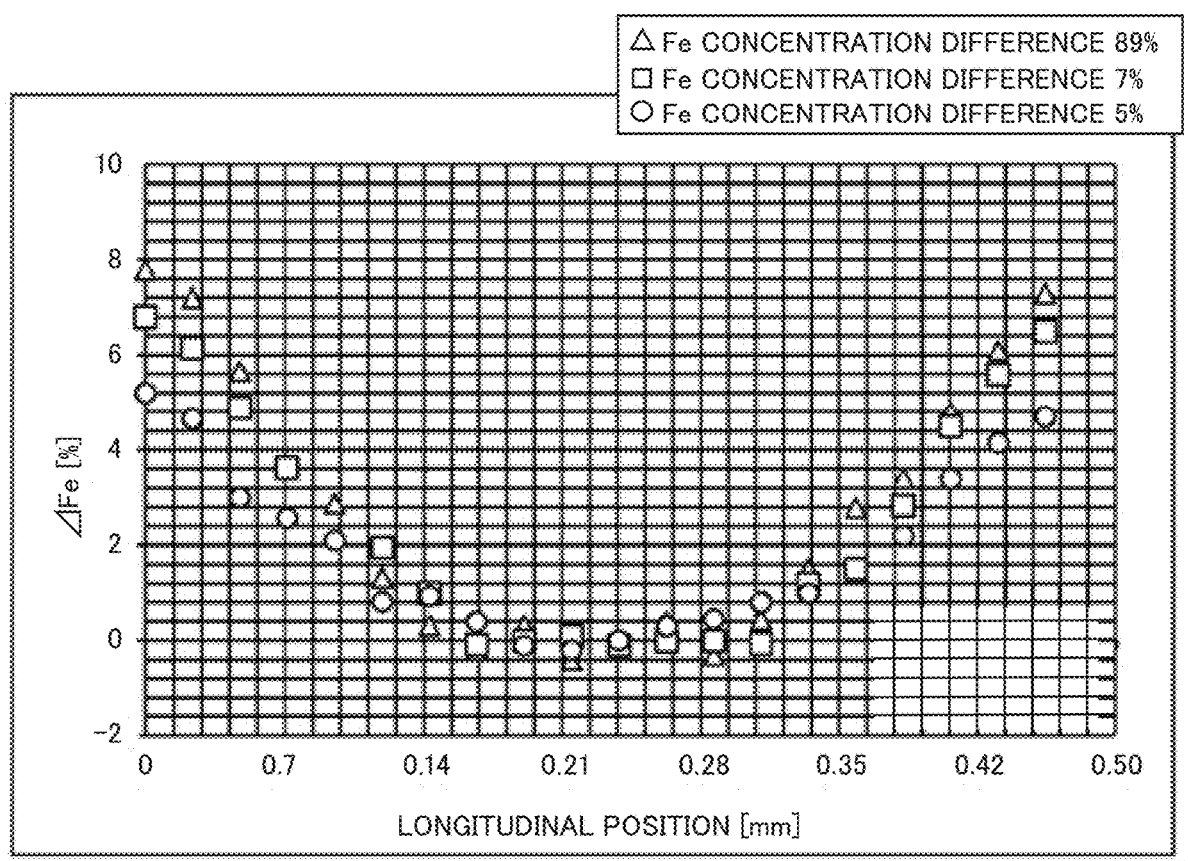
FIG. 18 is a graph showing change in Fe concentrations in magnetostrictive lines.

FIGS. 17 and 18 are graphs showing changes in the Fe concentrations in the magnetostrictive lines 2a. Each of FIGS. 17 and 18 shows a change in the Fe concentration at the height $H_1$ (height of an end $m_e$) in the cross section illustrated in FIG. 4. FIG. 17 is a graph showing an example of a change in the Fe concentration in each of the magnetostrictive film 2 having a Fe concentration difference of about 2%, the magnetostrictive film 2 having a Fe concentration difference of about 3%, and the magnetostrictive film 2 having a Fe concentration difference of about 4.5%. FIG. 18 is a graph showing an example of a change in the Fe concentration in each of the magnetostrictive film 2 having a Fe concentration difference of about 5%, the magnetostrictive film 2 having a Fe concentration difference of about 7%, and the magnetostrictive film 2 having a Fe concentration difference of about 8%.

In FIGS. 17 and 18, "LONGITUDINAL POSITION" on the abscissa in the graphs refers to a position in the width direction of the magnetostrictive lines 2a in the cross section illustrated in FIG. 4. In FIGS. 17 and 18, the position of the end $m_e$ of each magnetostrictive line 2a in the cross section illustrated in FIG. 4 is defined as a zero point at the "LONGITUDINAL POSITION." In FIGS. 17 and 18, ΔFe on the ordinate represents a Fe concentration difference (mass %). Each of FIGS. 17 and 18 shows a Fe concentration difference at each longitudinal position using, as zero, a Fe concentration difference in the center portion of the magnetostrictive line 2a (center portion in the width direction of the magnetostrictive line 2a in the cross section illustrated in FIG. 4).

Each of FIGS. 17 and 18 shows a Fe concentration of the magnetostrictive film 2 of a randomly selected one of the plurality of magnetic structures 20 among a plurality of magnetic structures 20 at each Fe concentration. Although not shown, the Fe concentration changes in a manner similar to those in the magnetostrictive lines 2a of the other magnetostrictive films 2.

Using the thus-obtained plurality of magnetic structures 20, the torque sensor 1 having the configuration illustrated in FIG. 1 was fabricated and sensitivity of the torque sensor 1 was measured. The sensitivity of the torque sensor 1 was measured by connecting the torque sensor 1 to the circuit illustrated in FIG. 11 and applying a torque of 80 Nm thereto. In the circuit, each of a resistor R1 and a resistor R2 was a resistor having a resistance value of 15Ω. Each of coils C1 and C2 was configured by winding, 124 times, a copper wire having a diameter of 0.2 mm and provided with an insulating coating.

Figure 19:
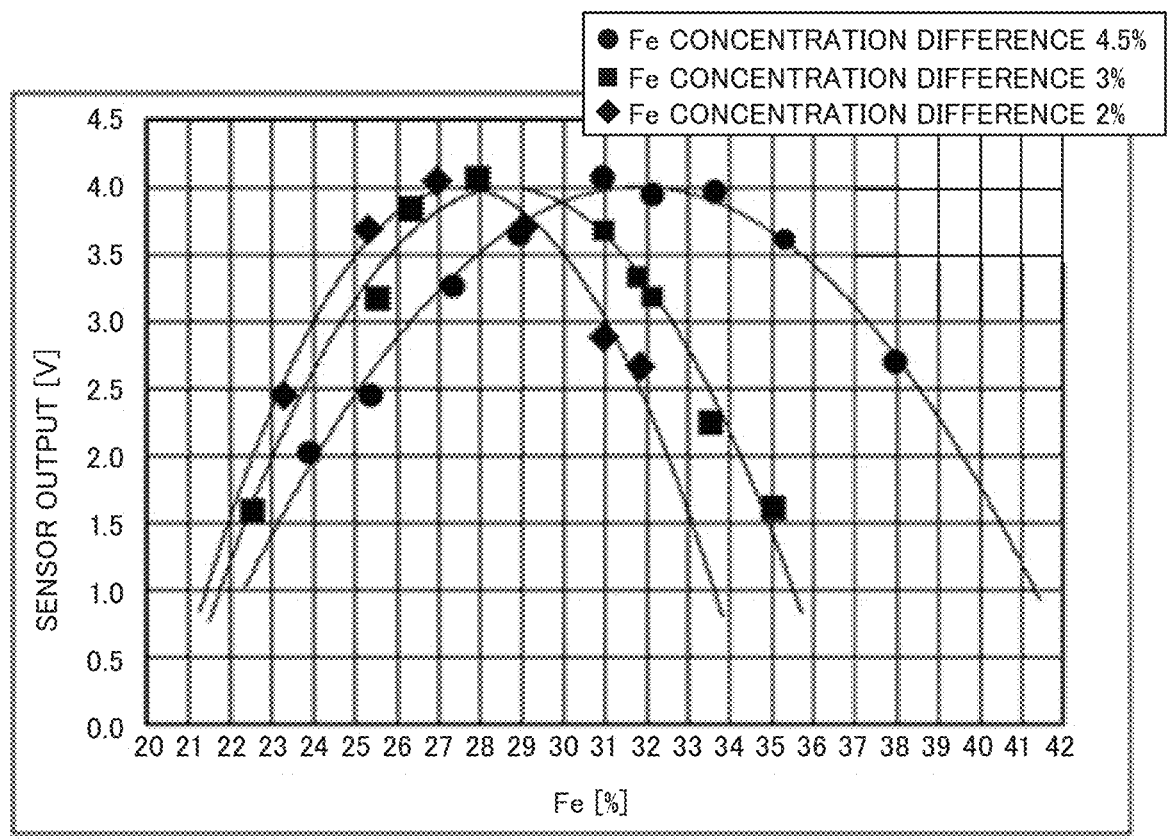
FIG. 19 is a graph showing relationships between the Fe concentration of a magnetostrictive film of the magnetic structure and the output of the torque sensor.
Figure 20:
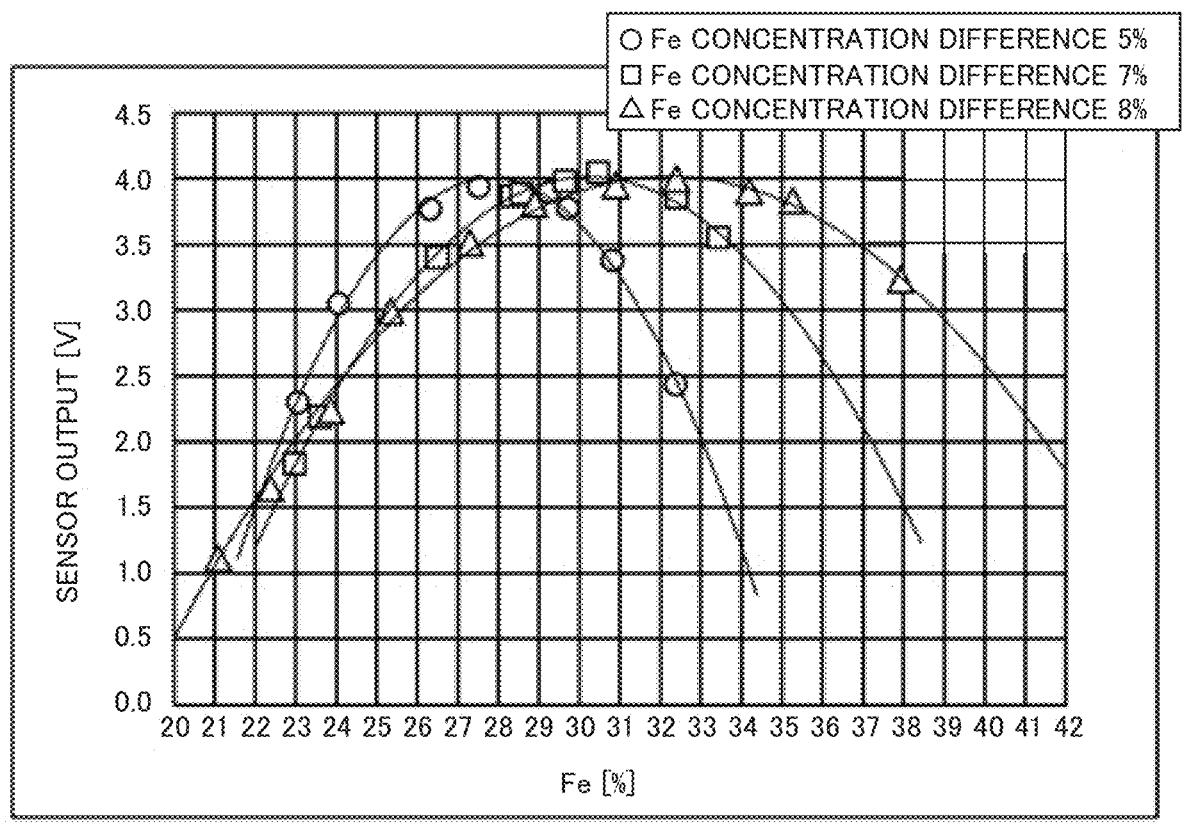
FIG. 20 is a graph showing relationships between the Fe concentration of the magnetostrictive film of the magnetic structure and the output of the torque sensor.

FIGS. 19 and 20 are graphs each showing a relationship between a Fe concentration of the magnetostrictive film 2 of the magnetic structure 20 and an output of the torque sensor 1 using the magnetic structure 20. Specifically, FIG. 19 shows outputs of torque sensors 1 using the magnetic structures 20 including the magnetostrictive films 2 having Fe concentration differences of about 2%, about 3%, or about 4.5%. FIG. 20 shows outputs of torque sensors 1 using the magnetic structures 20 including the magnetostrictive films 2 having Fe concentration differences of about 5%, about 7%, or about 8%. In FIG. 19, the abscissa represents a Fe concentration in a center portion of a randomly selected one of the magnetostrictive lines 2a of the magnetostrictive film 2 (center portion in the width direction of the magnetostrictive line 2a in the cross section illustrated in FIG. 4).

With reference to FIG. 19, in the torque sensor 1 using the magnetic structure 20 having a Fe concentration difference of about 2%, an output of 3 V or more was obtained in a case where the Fe concentration in the center portion of the magnetostrictive line 2a was about 24% to about 31%. In the torque sensor 1 using the magnetic structure 20 having a Fe concentration difference of about 3%, an output of 3 V or more was obtained in a case where the Fe concentration in the center portion of the magnetostrictive line 2a was about 24.5% to about 32.5%. In the torque sensor 1 using the magnetic structure 20 having a Fe concentration difference of about 4.5%, an output of 3V or more was obtained in a case where the Fe concentration in the center portion of the magnetostrictive line 2a was about 26.5% to about 37.5%. The difference between the maximum value and the minimum value of the Fe concentration in the center portion of the magnetostrictive line 2a in a case where an output of the torque sensor 1 is 3 V or more will be hereinafter referred to as a control range of the Fe concentration.

In the magnetostrictive film 2 having a Fe concentration difference of about 2%, the control range is about 7%. In the magnetostrictive film 2 having a Fe concentration difference of about 3%, the control range is about 8%. In the magnetostrictive film 2 having a Fe concentration difference of about 4.5%, the control range is about 11%.

Similarly, with reference to FIG. 20, in the magnetostrictive film 2 having a Fe concentration difference of about 5%, the control range is about 7%. In the magnetostrictive film 2 having a Fe concentration difference of about 7%, the control range is about 10%. In the magnetostrictive film 2 having a Fe concentration difference of about 8%, the control range is about 13%.

Figure 21:
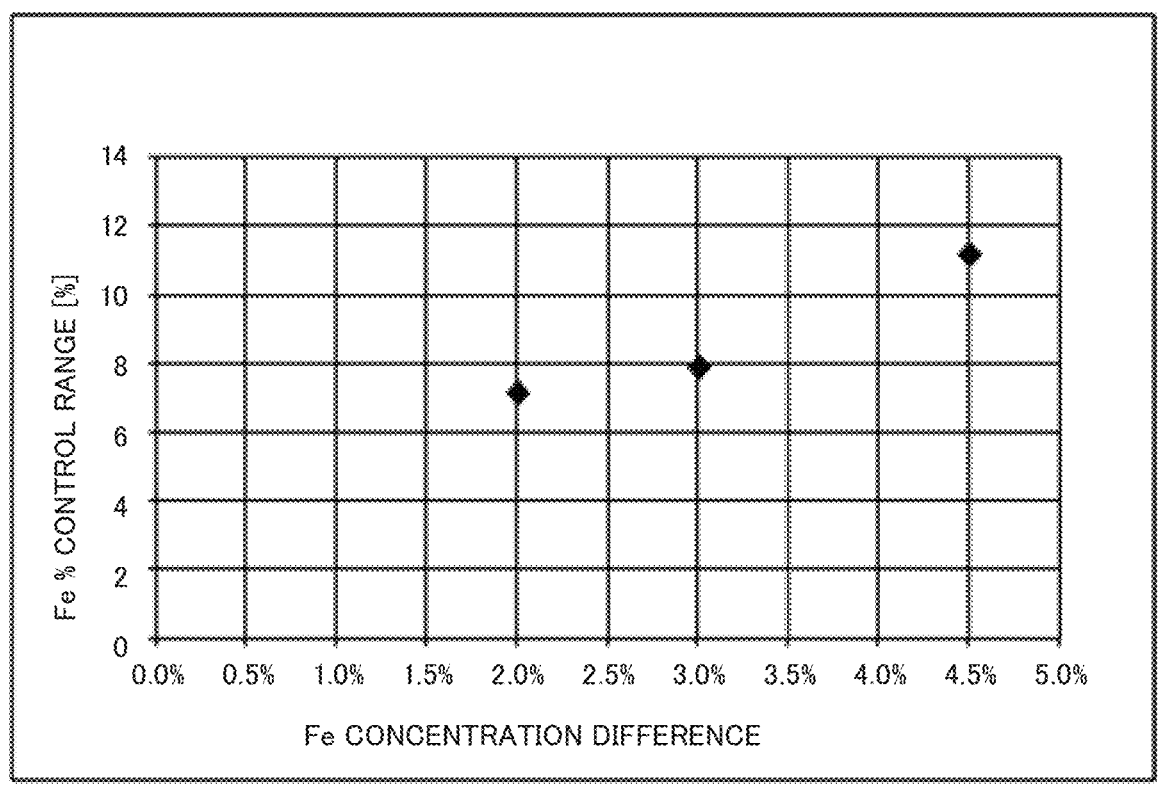
FIG. 21 is a graph showing relationships between the Fe concentration difference and the control range of the Fe concentration.
Figure 22:
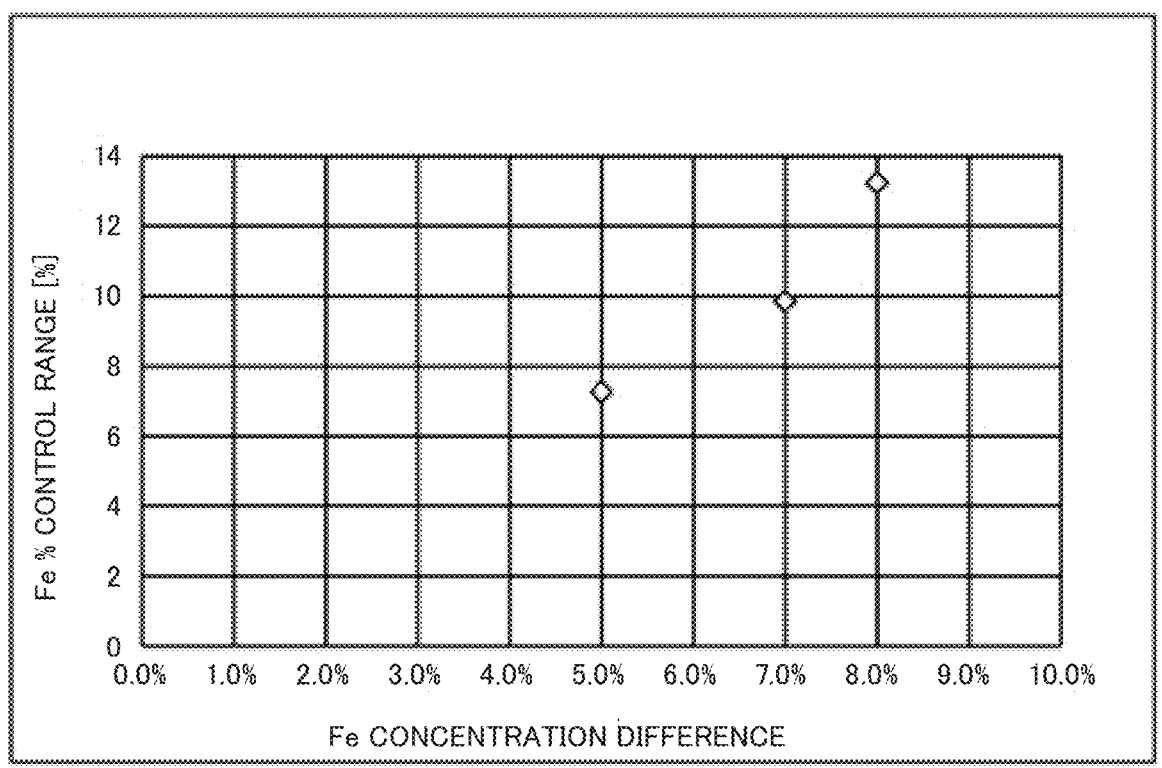
FIG. 22 is a graph showing relationships between the Fe concentration difference and the control range of the Fe concentration.

Each of FIGS. 21 and 22 shows a relationship between a Fe concentration difference and a control range of the Fe concentration. FIGS. 21 and 22 show that as the Fe concentration difference increases, the control range of the Fe concentration increases. That is, it was found to be possible that an increase in the concentration difference in at least one element in the magnetostrictive film 2 can increase an output of the torque sensor 1 even if the chemical composition of the magnetostrictive film 2 deviates to some degree from a target chemical composition. That is, it was found to be possible to achieve both an increase in sensitivity of the torque sensor 1 and facilitation of manufacturing of the torque sensor 1.

Second Example

A magnetic structure 20 that includes a magnetostrictive film 2 including the magnetostrictive lines 2a illustrated in FIG. 2 and having the cross section illustrated in FIG. 4 was obtained in the same manner as that of the first example, except that the thickness of the resist layer 91 for forming the magnetostrictive film 2 was 50 μm. The torque sensor 1 including the magnetic structure 20 according to this example shows sensitivity slightly inferior to that of the torque sensor according to the first example, but similar advantages as those of the torque sensor 1 according to the first example can be obtained.

Third Example

A magnetic structure 20 including the magnetostrictive lines 2a illustrated in FIG. 2 and having the cross section illustrated in FIG. 4 was obtained in the same manner as that of the first example, except that two or more plating baths storing different plating solutions were used for forming the magnetostrictive film 2. In the magnetostrictive film 2 of the magnetic structure 20 according to this example, the Fe concentration varies in the thickness direction. Advantages similar to those of the torque sensor 1 according to the first example were observed in the torque sensor 1 including the magnetic structure 20 according to this example.

INDUSTRIAL APPLICABILITY

The present invention is applicable to, for example, a magnetostrictive sensor for use in an electric motor-assisted bicycle.

The invention claimed is:
1. A magnetostrictive sensor, comprising:
a magnetic structure, including
a columnar substrate extending along an axis, and
a magnetostrictive portion disposed on an outer peripheral surface of the substrate, and containing a plurality of elements, wherein
the magnetostrictive portion including a plurality of portions that have different concentrations of at least one of the plurality of elements, the portions being so arranged as to satisfy at least one of
a first requirement that in a first cross sectional view of the magnetostrictive portion orthogonal to the axis, the portions having different concentrations of the at least one element are arranged clockwise about the axis,
a second requirement that in the first cross sectional view, the portions having different concentrations of the at least one element are arranged in a thickness direction of the magnetostrictive portion, and
a third requirement that, in a second cross sectional view of the magnetostrictive portion that is orthogonal to the first cross sectional view and passes through the axis, the portions having different concentrations of the at least one element are arranged along the axis.

2. The magnetostrictive sensor of claim 1, wherein the at least one element is an element forming a ferromagnet.

3. The magnetostrictive sensor of claim 1, further comprising
a coil disposed to surround the columnar substrate and the magnetostrictive portion formed thereon.

4. The magnetostrictive sensor of claim 3, wherein the coil comprises a plurality of coils arranged side by side along the axis.

5. The magnetostrictive sensor of claim 1, wherein the magnetostrictive portion contains at least a metal selected from the group consisting essentially of Ni, Fe, Co and Cr.

6. The magnetostrictive sensor of claim 1, wherein the magnetostrictive portion includes a plurality of magnetostrictive lines, which include adjacent first and second magnetostrictive lines that extend along an extension direction and are disposed on the outer peripheral surface of the substrate via respectively first and second contact areas, and
in a third cross sectional view of the magnetostrictive portion taken orthogonally to the extension direction, a first length, which is a width of a widest portion of the first magnetostrictive line in a width direction parallel to the outer peripheral surface of the substrate, is larger
than a second length that is a width of the first contact area in the width direction, and
than a third length that is a shortest distance between the first and second contact areas in the width direction.

7. The magnetostrictive sensor of claim 6, wherein in the third cross sectional view,
the first length is larger than a height of the first magnetostrictive line in a height direction perpendicular to the outer peripheral surface of the substrate.

8. The magnetostrictive sensor of claim 6, wherein in the third cross sectional view,
a height of the first magnetostrictive line, in a height direction perpendicular to the outer peripheral surface of the substrate, is larger than a first distance between the widest portion of the first magnetostrictive line and the outer peripheral surface of the substrate in the height direction.

9. The magnetostrictive sensor of claim 8, wherein in the third cross sectional view,
a half of the height of the first magnetostrictive line is greater than or equal to the first distance.

10. The magnetostrictive sensor of claim 6, wherein in the third cross sectional view,
a shortest distance between the first and second magnetostrictive lines in the width direction, between any portions thereof, is larger than zero.

11. A motor-driven device, comprising the magnetostrictive sensor of claim 1.

12. An electric motor-assisted bicycle, comprising the magnetostrictive sensor of claim 1.

13. A magnetostrictive structure, comprising:
a columnar substrate extending along an axis; and
a magnetostrictive portion disposed on an outer peripheral surface of the substrate, and containing a plurality of elements, wherein
the magnetostrictive portion including a plurality of portions that have different concentrations of at least one of the plurality of elements, the portions being so arranged as to satisfy at least one of
a first requirement that in a first cross sectional view of the magnetostrictive portion orthogonal to the axis, the portions having different concentrations of the at least one element are arranged clockwise about the axis,
a second requirement that in the first cross sectional view, the portions having different concentrations of the at least one element are arranged in a thickness direction of the magnetostrictive portion, and
a third requirement that, in a second cross sectional view of the magnetostrictive portion that is orthogonal to the first cross sectional view and passes through the axis, the portions having different concentrations of the at least one element are arranged along the axis.

14. A method for fabricating the magnetic structure of claim 13, the method comprising the steps of:
forming a resist layer having a predetermined pattern on the outer peripheral surface of the substrate; and
forming the magnetostrictive portion on the outer peripheral surface of the substrate on which the resist layer is disposed.

* * * * *